(12) United States Patent
Tang et al.

(10) Patent No.: US 6,879,012 B2
(45) Date of Patent: Apr. 12, 2005

(54) GIANT PLANAR HALL EFFECT IN EPITAXIAL FERROMAGNETIC SEMICONDUCTOR DEVICES

(75) Inventors: Hongxing Tang, Pasadena, CA (US); Michael L. Roukes, Pasadena, CA (US); Roland K. Kawakami, Riverside, CA (US); David D. Awschalom, Santa Barbara, CA (US)

(73) Assignees: The Regents of the University of California, Oakland, CA (US); California Institute of Technology, Pasadena, CA (US)

( * ) Notice: Subject to any disclaimer, the term of this patent is extended or adjusted under 35 U.S.C. 154(b) by 0 days.

(21) Appl. No.: 10/602,537

(22) Filed: Jun. 23, 2003

(65) Prior Publication Data

US 2004/0070038 A1 Apr. 15, 2004

Related U.S. Application Data

(60) Provisional application No. 60/390,977, filed on Jun. 21, 2002.

(51) Int. Cl.[7] .............................................. H01L 29/82
(52) U.S. Cl. ....................... 257/421; 257/425; 257/427; 257/48; 257/609; 257/615
(58) Field of Search ................................. 257/421, 425, 257/427, 48, 609, 615

(56) References Cited

U.S. PATENT DOCUMENTS

| | | | |
|---|---|---|---|
| 3,818,328 A | | 6/1974 | Zinn |
| 4,315,273 A | * | 2/1982 | Yamamoto et al. ......... 257/425 |
| 4,443,809 A | * | 4/1984 | Chin et al. .................. 257/184 |
| 4,618,901 A | | 10/1986 | Hatakeyama et al. |
| 4,816,946 A | | 3/1989 | Kira et al. |
| 5,390,061 A | | 2/1995 | Nakatani et al. |
| 6,734,514 B2 | * | 5/2004 | Robert et al. ............... 257/425 |
| 2004/0066674 A1 | * | 4/2004 | Tang et al. .................. 365/200 |
| 2004/0070038 A1 | * | 4/2004 | Tang et al. .................. 257/421 |

FOREIGN PATENT DOCUMENTS

WO  WO 2004/001805 A2  12/2004

OTHER PUBLICATIONS

Abolfath, M. et al., "Theory of magnetic anisotropy in $III_{1-x}Mn_xV$ Ferromagnets," Phys. Rev. B., vol. 63, p. 054418, (Jan. 2001).

Cowburn, R.P. et al., "Multijump magnetic switching in in–plane magnetized ultrathin epitaxial Ag/Fe/Ag(001) films," Phys. Rev. Lett., vol.79, p. 4018, (Nov. 1997).

Dietl, R. et al., "Hole–mediated ferromagnetism in tetrahedrally coordinated semiconductors," Phys. Rev. B, vol. 63, p. 195205, (Apr. 2001).

(Continued)

Primary Examiner—Mark V. Prenty
(74) Attorney, Agent, or Firm—Foley & Lardner LLP

(57) ABSTRACT

Ferromagnetic semiconductor-based compositions, systems and methods that enable studies of the dynamics and magnetoresistance of individual magnetic domain walls, and which provide enhanced magnetic switching effects relative to metallic ferromagnets. Aspects of the present invention are enabled by recent studies of the Giant Planar Hall effect (GPHE), and in particular GPHE in (Ga,Mn)As—based devices. The GPHE generally originates from macro- and micromagnetic phenomena involving single domain reversals. The GPHE-induced resistance change in multiterminal, micron-scale structures patterned from (Ga,Mn)As can be as large as about $100\Omega$, four orders of magnitude greater than analogous effects previously observed in metallic ferromagnets. Accordingly, recent data provide sufficient resolution to enable real-time observations of the nucleation and field-induced propagation of individual magnetic domain walls within such monocrystalline devices. The magnitude of the GPHE is generally size-independent down to the submicron scale indicating that for applications involving nanostructures it is capable of sensitivity comparable to SQUID-based techniques.

52 Claims, 14 Drawing Sheets

OTHER PUBLICATIONS

Dietl, R. et al., "Zener model description of ferromagnetism in zinc–blende magnetic semiconductors," *Science*, vol. 287, p. 1019, (Feb. 2000).

Divincenzo, D.P., "Quantum computing and single–qubit measurements using the spin–filter effect (invited)," *J. Appl. Phys.*, vol. 85, p. 4785, (Apr. 1999).

Fukumura, T. et al., "Magnetic domain structure of a ferromagnetic semiconductor (Ga,Mn)As observed with scanning probe microscopes," *Physica E.*, vol. 10., p. 135 (2001).

Gwo, S. et al. "Surface reconstruction and ultrasmooth morphology of high–temperature grown AlAs(001)–3x2," *Proc. 23rd Int. Conf. Phys. Semiconductors*, Berlin 1996, Scheffler, M. and R. Zimmermann, eds., World Scientific, Singapore, (Jul. 1996).

Hong, K. and N. Giordano, "Approach to microscopic magnetic measurements," *Phys. Rev.*, vol. 51, No. 15, p. 9855, (Apr. 1995).

Jan, J.P., "Galvanomagnetic and thermomagnetic effects in metals," in *Solid State Physics*, Seitz, F. and D. Turnbull, eds., New York Academic Press, vol. 5, pp. 1–96, 1957.

König, J. et al., "Theory of magnetic properties and spin–wave dispersion for ferromagnetic (Ga,Mn)As," *Phys. Rev. B.*, vol. 64, p. 194423, (Oct. 2001).

Ma, Z. et al., "Solid–state reaction–mediated low–temperature bonding of GaAs and InP wafers to Si substrates," *Appl. Phys. Lett.*, vol. 64, No. 6, p. 772, (Feb.1994).

Ohno, H. et al., "Electric–field control of ferromagnetism," *Nature*, vol. 401, p. 944, (Dec. 2000).

Ono, T. et al., "Propagation of a magnetic domain wall in a submicrometer magnetic wire," *Science*, vol. 284, p. 468, (Apr. 1999).

Prinz, G., "Magnetoelectronics," *Science*, vol. 282, p. 1660, (Nov. 1998).

Sander, D. et al., "Film stress and domain wall pinning in sesquilayer Iron films on W(110)" *Phys. Rev. Lett.*, vol. 77, p. 2566, (Sep. 1996).

Schmidt, G. and L.W. Mollenkamp, "Electrical spin injection using dilute magnetic semiconductors" *Phisica E.*, vol. 10, p. 84 (2001).

Stoner, E.C. and E.P. Wohlfarth, "A mechanism of magnetic hysteresis in heterogeneous alloys," *Philos. Trans. R. Soc. London A*, vol. 240, p. 74, (May 1948).

Wunderlich, J. et al., "Influence of geometry on domain wall propagation in a mesoscopic wire" IEEE Trans. Magn. vol. 37, p. 2104, (Jul. 2001).

* cited by examiner

- First Jump
- Second Jump

● $\Delta R_H / R_\square$
○ Squid M

GIANT PLANAR HALL EFFECT IN EPITAXIAL FERROMAGNETIC SEMICONDUCTOR DEVICES

CROSS-REFERENCES TO RELATED APPLICATIONS

This application is a non-provisional application of, and claims priority to, U.S. Provisional Application Ser. No. 60/390,977, filed Jun. 21, 2002, which is hereby incorporated by reference in its entirety. This application is also related to U.S. Non-provisional application Ser. No. 10/602, 548, filed on even date herewith, which is hereby incorporated by reference in its entirety.

STATEMENT AS TO RIGHTS TO INVENTIONS MADE UNDER FEDERALLY SPONSORED RESEARCH OR DEVELOPMENT

The government may have certain rights to the invention through DARPA under Grant No. DSO/SPINS-MDA 972-01-1-0024, and Grant No. DARPA/ONR N00014-99-1-1096, and from the AFOSR under Grant No. F49620-02-10036.

BACKGROUND OF THE INVENTION

The present invention relates generally to semiconductor-based magnetic materials and devices, and more particularly to ferromagnetic semiconductor materials and ferromagnetic semiconductor-based devices, and methods of using the same.

Ferromagnetic semiconductors are of considerable current interest since they offer prospects for realizing semiconducting spintronics devices that have no analogs in a metallic ferromagnetic system (see, e.g., G. Prinz, *Science* 282, 1660 (1998); S. A. Wolf et al., *Science* 294, 1488 (2001).). One recent and striking example is the electric field control of ferromagnetism (see, H. Ohno et al., *Nature* (London) 408, 944 (2000).). Semiconductor-based magnetic materials also offer new possibilities for attaining great improvements in performance over metallic magnetic devices. Among the examples here is conductivity matching to attain efficient spin injection into semiconductors (see, e.g., G. Schmidt et al., *Phys. Rev.* B 62, R4790 (2000).). Semiconductor ferromagnetism also gives rise to new physical phenomena because it is possible to engineer, and enhance, spin-orbit coupling in ways that are not possible in metallic systems.

Advances in nanofabrication and epitaxial growth bring new levels of control and resolution to the study of magnetic domains at the microscopic level. Recent research efforts are focused upon two principal thrusts: studies of domain wall dynamics, and investigations of domain wall resistance. After decades of concerted study on metallic ferromagnetic thin films, it is generally agreed that magnetization reversal within high quality magnetic microstructures occurs first by nucleation, then propagation, of domain walls (see, e.g., J. Ferré, *Topics Appl. Phys.* 83, 127 (2002)). As regards the latter, even though the resistance of domain walls is difficult to measure, it has become a topic of significant current interest (see, M. Viret, et al., *Phys. Rev. Lett.* 85, 3962 (2000); U. Ruediger, J. Yu, S. Zhang, A. D. Kent, S. S. P. Parkin, *Phys. Rev. Lett.* 80, 5639 (1998); L. Klein et al., *Phys. Rev. Lett.* 84, 6090 (2000); R. Danneau et al., *Phys. Rev. Lett.* 88, 157201 (2002); U. Ebels, A. Radulescu, Y. Henry, L. Piraux, K. Ounadjela, *Phys. Rev. Lett.* 84, 983 (2000); T. Taniyama, I. Nakatani, T. Namikawa, Y. Yamazaki, *Phys. Rev. Lett.* 82, 2780 (1999); and Y. B. Xu et al., *Phys. Rev. B* 61, R14901 (2000)). This is due to both the important role domain wall resistance might play in advanced spintronic devices, as well as the challenges it poses for both experimental and theoretical attempts to obtain fundamental understanding of its underlying physics.

Currently, there are several experimental approaches to the study of domain wall dynamics. One of the principal techniques is time-resolved imaging via the magneto-optic Kerr effect (MOKE) (see, S. B. Choe, S. C. Shin, *Phys. Rev. Lett.* 86, 532 (2001); S. Lemerle et al., *Phys. Rev. Lett.* 80, 849 (1998); and D. A. Allwood et al., *Science* 296, 2003 (2002)), an optical method that can provide sufficient contrast to directly observe the growth or shrinkage of magnetic domains within a sample. Another recently developed approach is based upon electrical measurements via the giant magnetoresistance (GMR) effect, which has enabled investigations of domain wall propagation in submicron Permalloy wires (see, e.g., T. Ono et al., *Science* 284, 468 (1999)). In the latter work, the observed ~1Ω GMR jumps emanate from regions that are smaller than is readily accessible to MOKE. However, this electrically-based approach is complicated by relatively small signal levels and the sample's multiple ferromagnetic layers.

At present, understanding of domain wall resistance is unsettled—there exists a conflicting body of work in the literature. Early theoretical studies (see, e.g., G. G. Cabrera, L. M. Falicov, *Phys. Status Solidi* B 61, 59 (1974); ibid. 62, 217 (1974) and L. Berger, *J. Appl. Phys.* 49, 2156 (1978)) predict that a domain wall should contribute minimally to the resistivity of a ferromagnet. This is predicated upon adiabatic electron transfer across a domain wall, based upon the reasonable assumption that the wall width is much greater than the Fermi wavelength. However, it was also pointed out that the different magnetization orientations of adjacent domains might locally perturb the current distribution and thereby yield an effect. More recent theoretical efforts strive to clarify this situation, but models yielding both positive and negative domain wall resistance have been explicated (see, P. M. Levy, S. Zhang, *Phys. Rev. Lett.* 79, 5110 (1997); G. Tatara, H. Fukuyama, *Phys. Rev. Lett.* 78, 3773 (1997); R. P. van Gorkom, A. Brataas, G. E. W. Bauer, *Phys. Rev. Lett.* 83, 4401 (1999); and M. Viret et al., *Phys. Rev. B* 53, 8464 (1996)). On the experimental side, measurements of domain wall resistance have been indirect; it is typically inferred by measuring the excess resistance arising when large ensembles of domain walls are nucleated within a sample (see, M. Viret, et al., *Phys. Rev. Lett.* 85, 3962 (2000); U. Ruediger, J. Yu, S. Zhang, A. D. Kent, S. S. P. Parkin, *Phys. Rev. Lett.* 80, 5639 (1998); and L. Klein et al., *Phys. Rev. Lett.* 84, 6090 (2000)). Recent progress in domain imaging and nanofabrication now allows resistance measurements on samples containing significantly reduced numbers of domain walls (see, U. Ebels, A. Radulescu, Y. Henry, L. Piraux, K. Ounadjela, *Phys. Rev. Lett.* 84, 983 (2000); T. Taniyama, I. Nakatani, T. Namikawa, Y. Yamazaki, *Phys. Rev. Lett.* 82, 2780 (1999); and Y. B. Xu et al., *Phys. Rev. B* 61, R14901 (2000)). However, to date, experimental results that have emerged from these various methods are also conflicting; both positive (see, M. Viret, et al., *Phys. Rev. Lett.* 85, 3962 (2000); L. Klein et al., *Phys. Rev. Lett.* 84, 6090 (2000); U. Ebels, A. Radulescu, Y. Henry, L. Piraux, K. Ounadjela, *Phys. Rev. Lett.* 84, 983 (2000); and Y. B. Xu et al., *Phys. Rev. B* 61, RI 4901 (2000)) and negative (see, U. Ruediger, J. Yu, S. Zhang, A. D. Kent, S. S. P. Parkin, *Phys. Rev. Lett.* 80, 5639 (1998) and T. Taniyama, I. Nakatani, T. Namikawa, Y. Yamazaki, *Phys. Rev. Lett.* 82, 2780 (1999)) domain wall resistance are reported.

It is clear that there is a need for ferromagnetic semiconductor-based systems and techniques that provide improved measurements of domain wall resistance and domain wall dynamics relative to prior systems, as well as enhanced magnetic switching effects.

BRIEF SUMMARY OF THE INVENTION

The present invention provides methods, devices and compositions that provide exceptional magnetic switching effects as well as enhanced domain wall magnetic property measurement and analysis relative to prior systems.

In certain aspects, the present invention provides novel ferromagnetic semiconductor-based compositions, systems and methods that enable studies of the dynamics and magnetoresistance of individual magnetic domain walls, and which provide enhanced magnetic switching effects relative to metallic ferromagnets. Aspects of the present invention are enabled by recent studies of the Giant Planar Hall effect (GPHE), and in particular GPHE in (Ga,Mn)As—based devices. The GPHE generally originates from macro- and micromagnetic phenomena involving single domain reversals. The GPHE-induced resistance change in multiterminal, micron-scale structures patterned from (Ga,Mn)As can be as large as about 100Ω, four orders of magnitude greater than analogous effects previously observed in metallic ferromagnets. Accordingly, recent data provide sufficient resolution to enable real-time observations of the nucleation and field-induced propagation of individual magnetic domain walls within such monocrystalline devices. The magnitude of the GPHE is generally size-independent down to the submicron scale indicating that for applications involving nanostructures it is capable of sensitivity comparable to SQUID-based techniques (see, e.g., M. van Kooten, S. de Hann, J. C. Lodder, Th. J. A. Popma, *J. Appl. Phys.* 75, 5508 (1994)).

According to an aspect of the present invention, a ferromagnetic semiconductor composition is provided that typically includes a substrate layer, and a ferromagnetic semiconductor epilayer formed on the substrate, with the epilayer defining a plane and having a cubic hard axis. In one aspect, a voltage transverse to the cubic hard axis is detectable in response to an applied current flow along the cubic hard axis. In certain aspects, the substrate is a type III–V semiconductor, and the epilayer is a Mn-doped type III–V semiconductor. In one aspect, for example, the substrate is GaAs and the epilayer is $Ga_{1-x}Mn_xAs$ and having a thickness of between about 10 nm (or less) and about 350 nm or more, where "x" is selected, such that the concentration of Ga to Mn is between about 100:1 and about 100:8.

According to another aspect of the present invention, a ferromagnetic semiconductor device is provided that typically includes a substrate defining a plane, and a ferromagnetic semiconductor epilayer formed on the substrate, with the epilayer being substantially elongated and oriented along a cubic hard axis. The device also typically includes first and second electrical contacts, each contact coupled to an end of the elongated epilayer. In certain aspects, the contacts are configured to provide an electrical current flow along the hard axis. In one aspect, application of an electrical current flow along the hard axis produces a voltage substantially transverse to the hard axis. In certain aspects, the substrate is a type III–V semiconductor, and the epilayer is a Mn-doped type III–V semiconductor. In one aspect, for example, the substrate is GaAs and the epilayer is $Ga_{1-x}Mn_xAs$ and having a thickness of between about 10 nm (or less) and about 350 nm or more, where "x" is selected such that the concentration of Ga to Mn is between about 100:1 and about 100:8.

According to yet a further aspect of the present invention, a method of measuring magnetic domain wall parameters in ferromagnetic-semiconductor materials is provided. The method typically includes providing a test sample including a ferromagnetic semiconductor epilayer formed on a substrate, with the epilayer being substantially planar and having a cubic hard axis and being substantially elongated. The method also typically includes providing a current flow along the cubic hard axis, and detecting a transverse voltage in the epilayer responsive to the current flow at each of a plurality of transverse voltage probe pairs in contact with the epilayer, each pair having a probe in contact with the epilayer on opposite sides relative to the cubic hard axis. In certain aspects, an in-plane magnetic field, or a magnetic field having an in-plane component, is applied to the test sample so as to determine one or more parameters representative of domain wall dynamics. The applied magnetic field (or in-plane component) in one aspect is fixed in magnitude and swept radially in the plane, and in another aspect is fixed in direction and swept in magnitude.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 1(a) also shows an electron micrograph of a Hall device.

FIG. 2 shows the temporal evolution of domain wall propagation using the device of FIG. 1(a), measured via a series of GPHE measurements at 5° K, for applied in-plane magnetic fields stepped between 74 Oe and 88 Oe. Inset

$$\delta R = R^U - R^D = R^L - R^R.$$

Figure 4A:
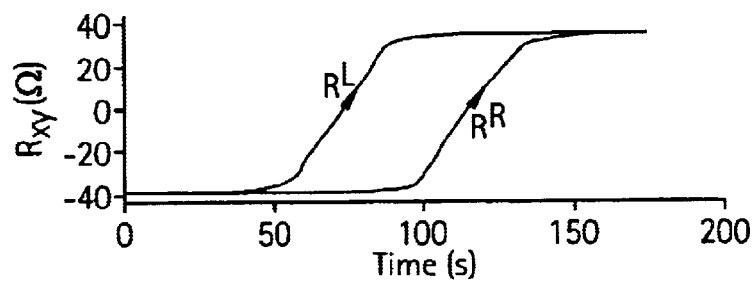
FIG. 4(a) shows GPHE signals from two pairs of transverse probes that monitor the arrival and departure of a single domain wall from the "measurement region" between probes.
Figure 4B:
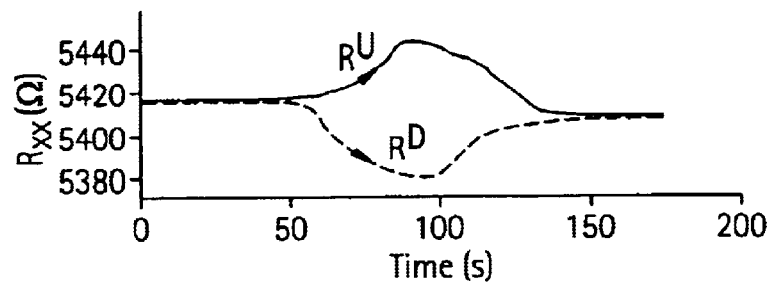
FIG. 4(b) shows longitudinal resistances across the wall measured simultaneously from top and bottom of the device.
Figure 4C:
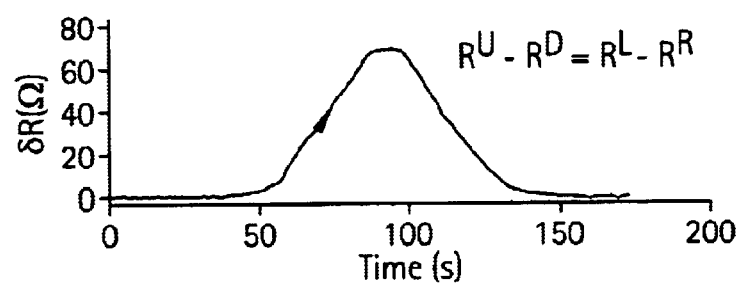
FIG. 4(c) shows the resistance differences satisfy a sum rule.
Figure 4D:
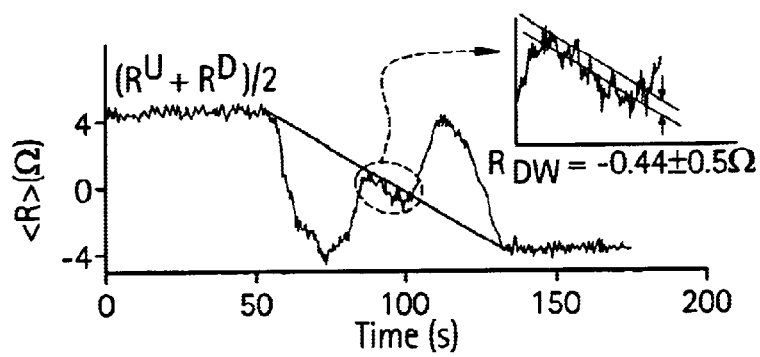
FIG. 4 shows time-resolved magnetoresistance measured across a single domain wall at 5K.

FIG. 4(d) shows the average, $<R> = (R^U + R^D)/2$, which effectively separates the magnetoresistance of an individual domain from obfuscating GPHE signals. The central portion of this trace, obtained when the domain wall is completely localized between the outermost transverse probes, displays a small, but distinct, offset from the interpolation between asymptotic resistance values.

Figure 4E:
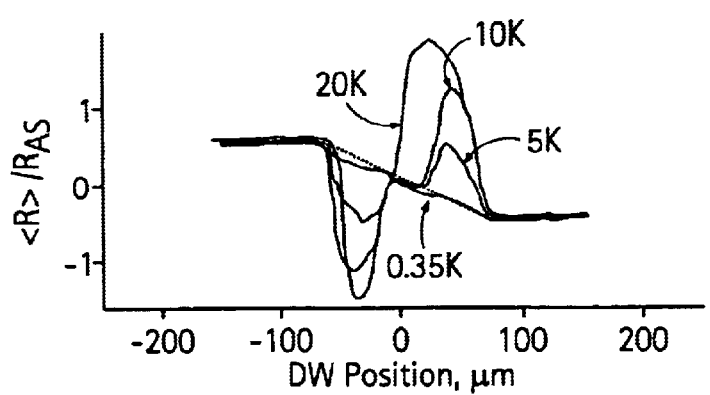

FIG. 4(e) shows the temperature dependence of the averaged longitudinal resistance, scaled by the asymptotic resistance jump height, $R_{AS}$. As shown, the resistance offset at the center of the traces, arising from the presence of a single domain between probes, does not change markedly with temperature. However, above ~10K, increased "tails" (FIG. 4(a)) make it increasingly difficult to evaluate this offset.

Figure 5A:
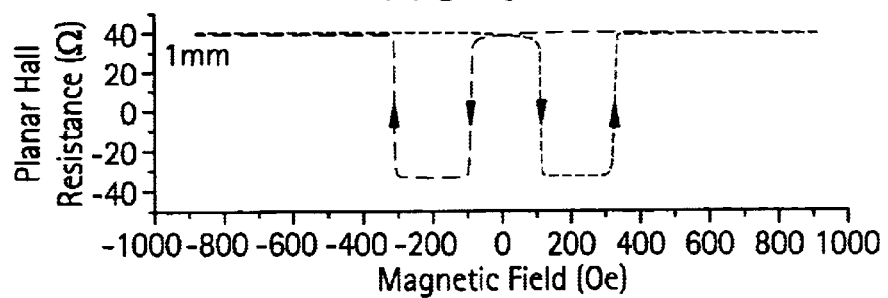
Figure 5B:
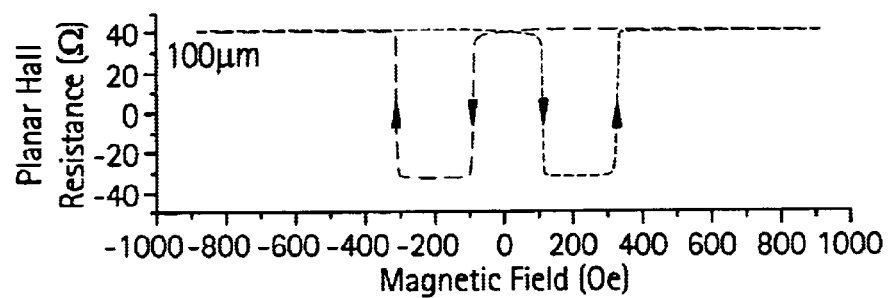
Figure 5C:
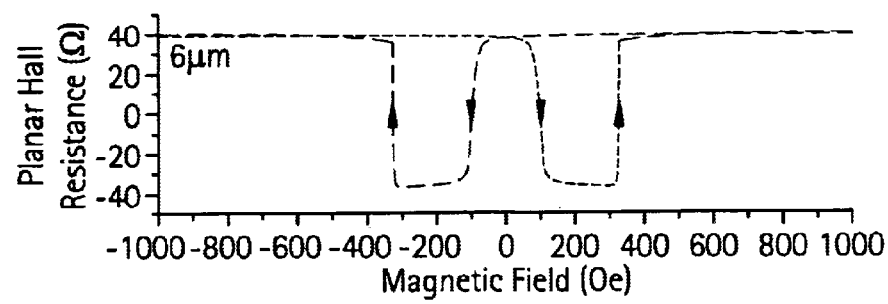

FIGS. 5(a)–5(c) show families of data taken from Hall bars spanning in width from 6 µm to macroscopic (1 mm) dimensions. These are obtained for orientation $\phi_H = 20°$ away from [110].

Figure 5D:
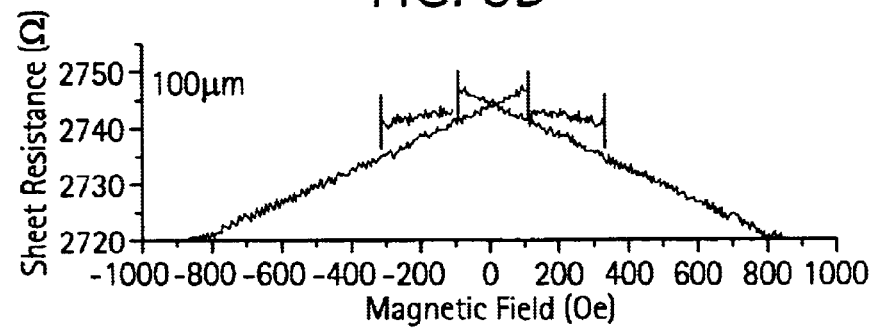

FIG. 5(d) shows the field-dependent sheet resistance of a 100 µm (wide) Hall bar.

Figure 5E:
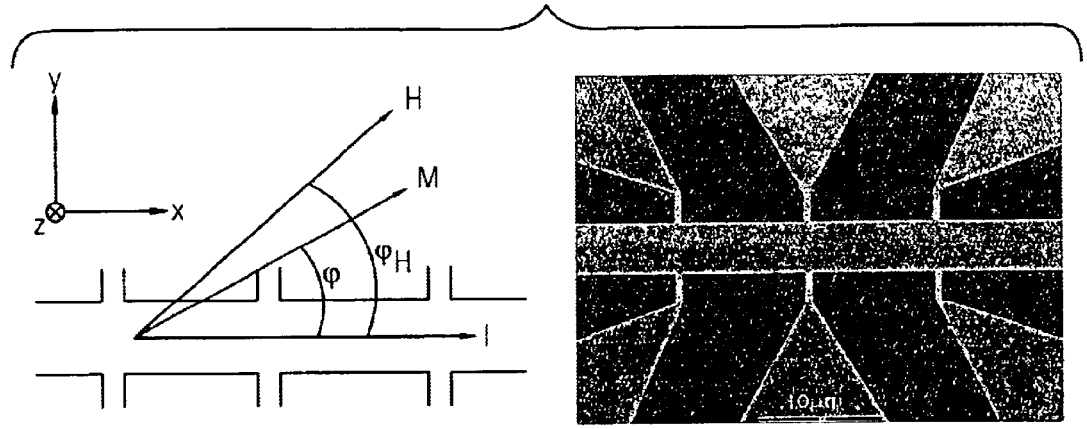

FIG. 5(e) shows the relative orientations of the sensing current I, the external field H, and the magnetization M in a Hall bar device similar to the device shown in FIG. 1. A SEM micrograph of a 6-µm-wide device is also shown.

Figure 5F:
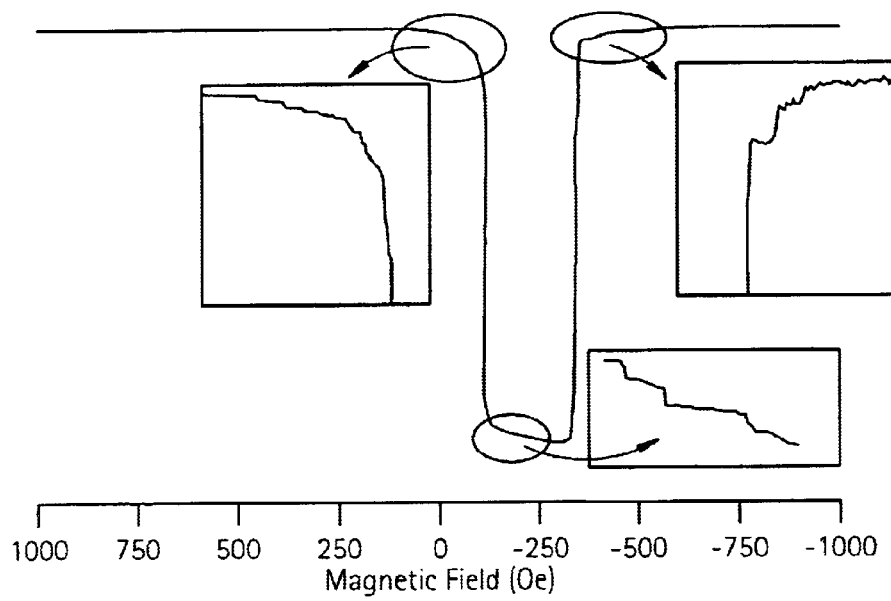

FIG. 5(f) shows the Barkhausen jumps that are evident in 6-µm-wide devices near the resistance transitions.

FIG. 6 shows the angular dependence of the GPHE.

Figure 6A:
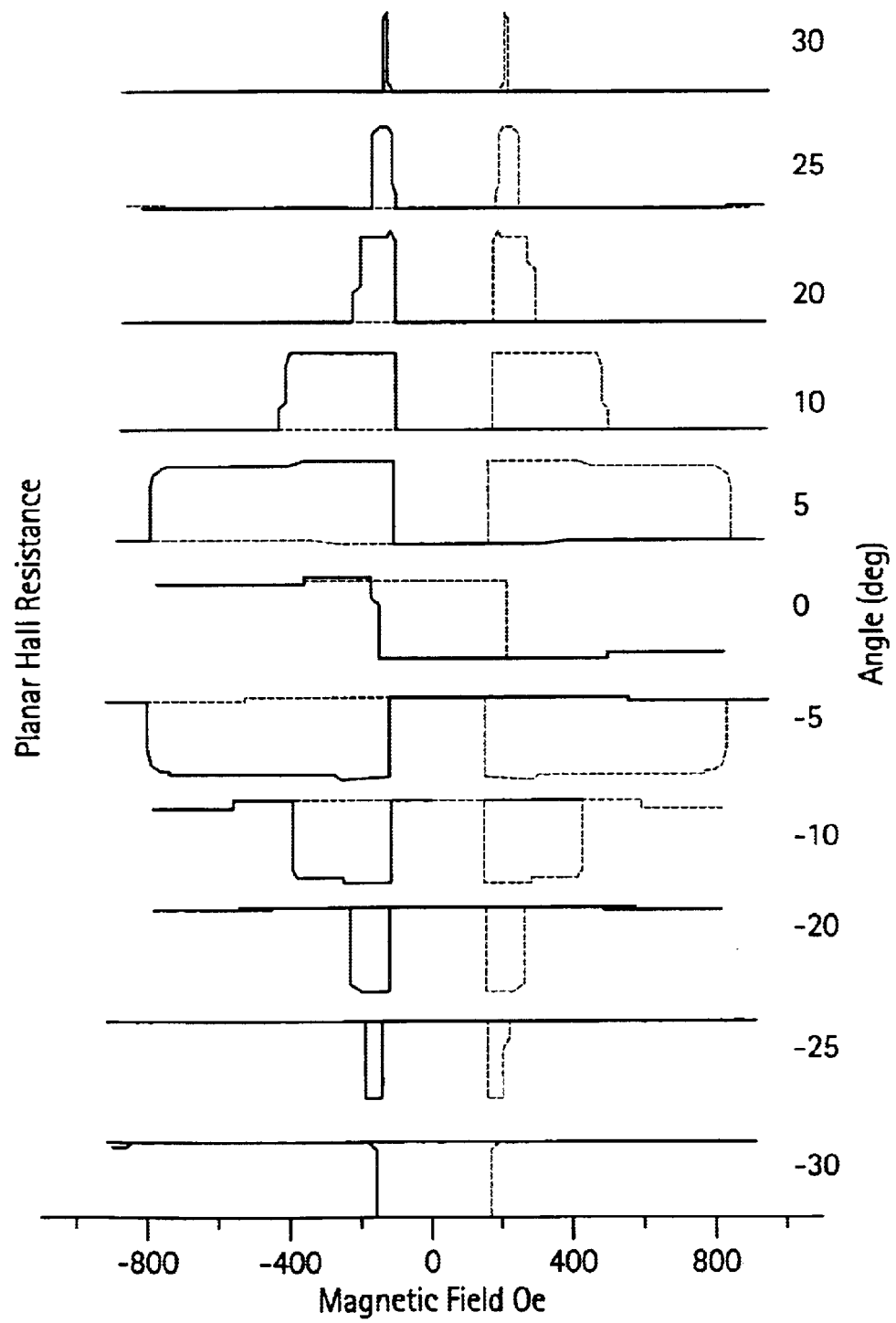

FIG. 6(a) shows the dependence of R-H loops upon field orientation angle $\phi_H$ as it is varied from $-30°$ to $30°$ in the plane of the device.

Figure 6B:
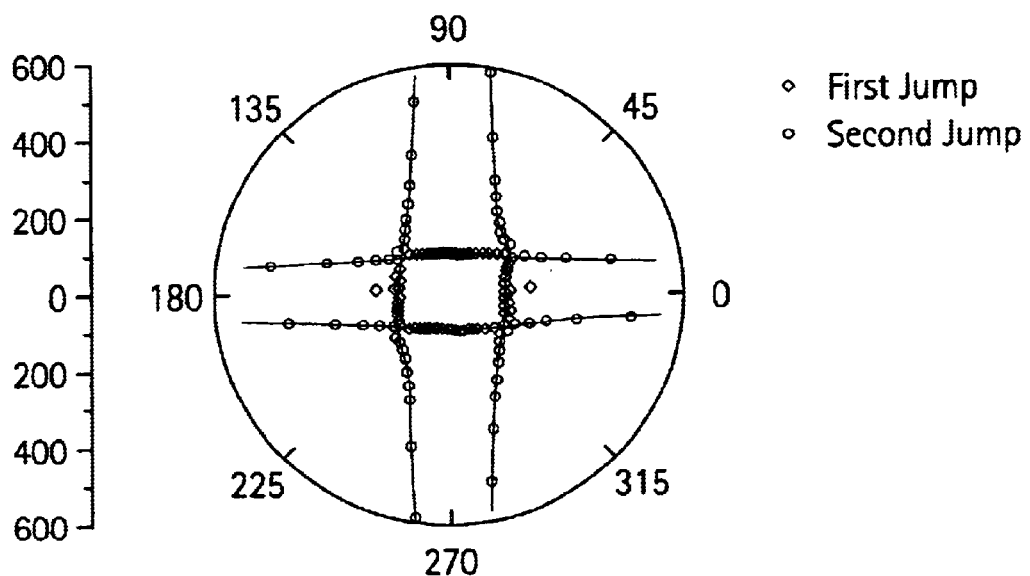

FIG. 6(b) summarizes the signatures of the coercive fields manifested in the electrical transport measurements.

Figure 6C:
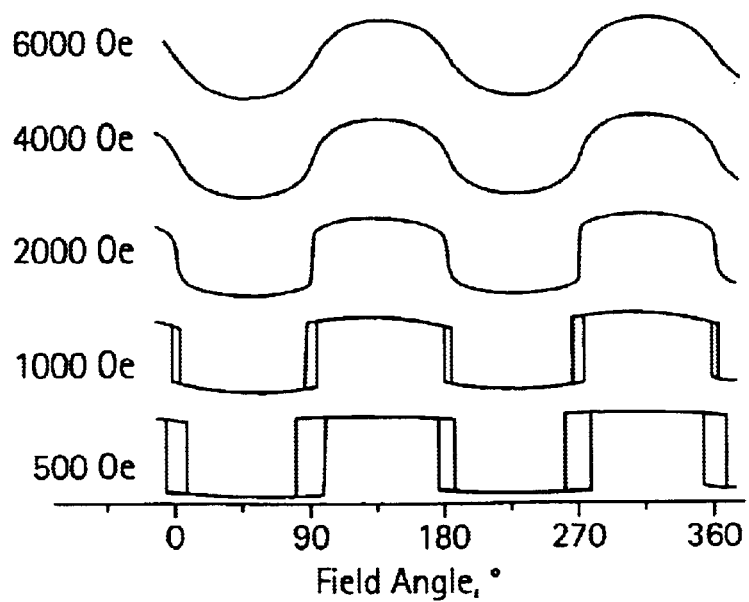

FIG. 6(c) shows the planar Hall resistance measurements for a series of fixed-magnitude clockwise and counterclockwise sweeps of magnetic field orientation at different (fixed) magnitudes.

Figure 7A:
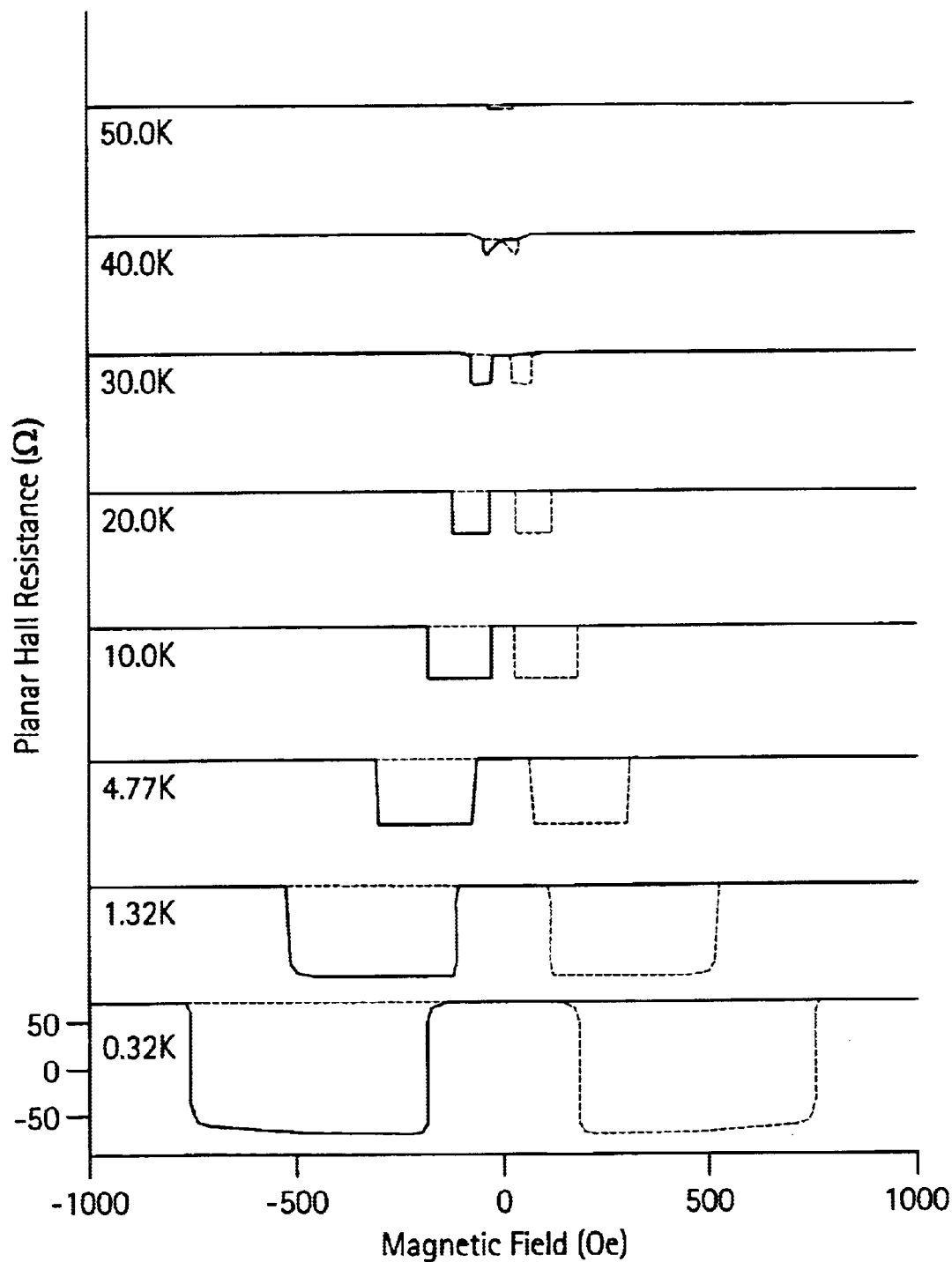

FIG. 7(a) shows the temperature dependence of the GPHE for a 10 µm Hall bar, measured under conditions of careful temperature regulation, stepped downward from 50 to 0.32 K, for fixed-orientation, swept-magnitude, applied magnetic fields.

Figure 7B:
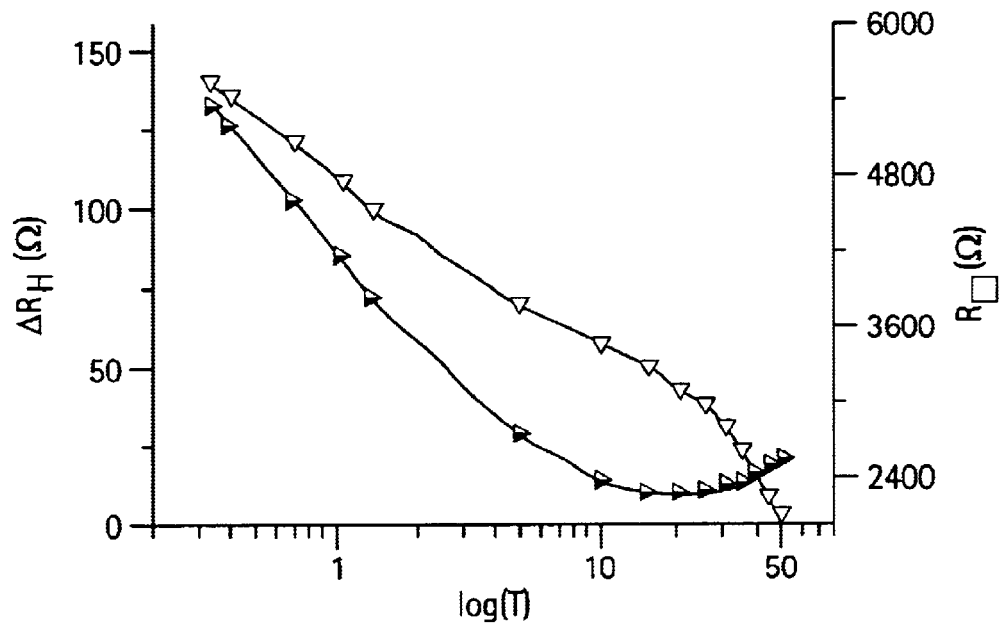

FIG. 7(b) shows semilog plots of the planar Hall resistance jump, $\Delta R_H$, and sheet resistance, R, vs temperature.

Figure 7C:
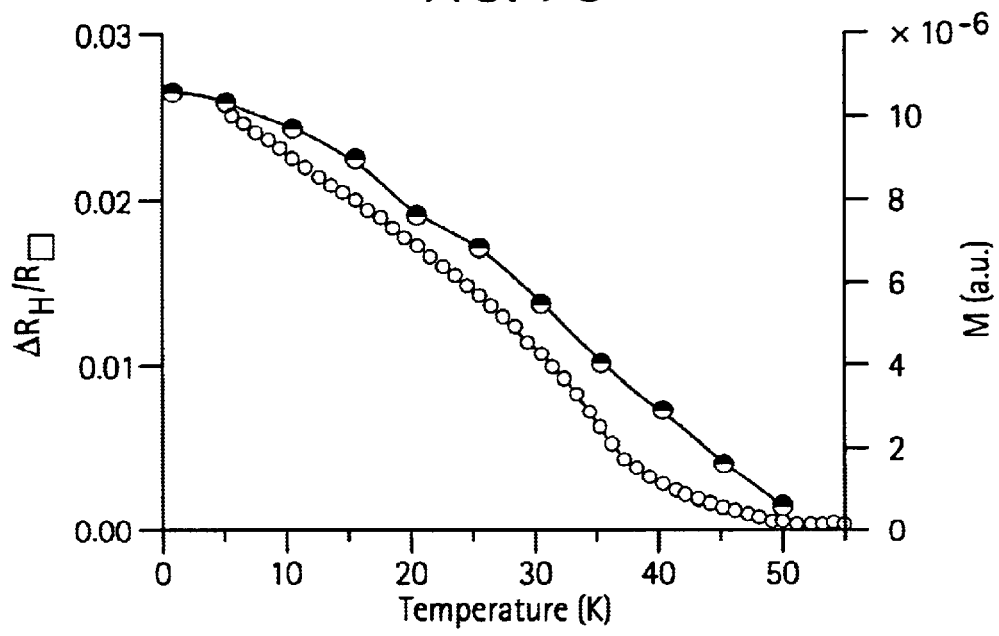

FIG. 7(c) shows a comparison between the ratio, $\Delta R_H/R_\square$, measured on a 10-µm-wide Hall device, and the sample magnetization, M, measured by SQUID magnetometry on a macroscopic [(3×3) mm²] sample.

Figure 8:
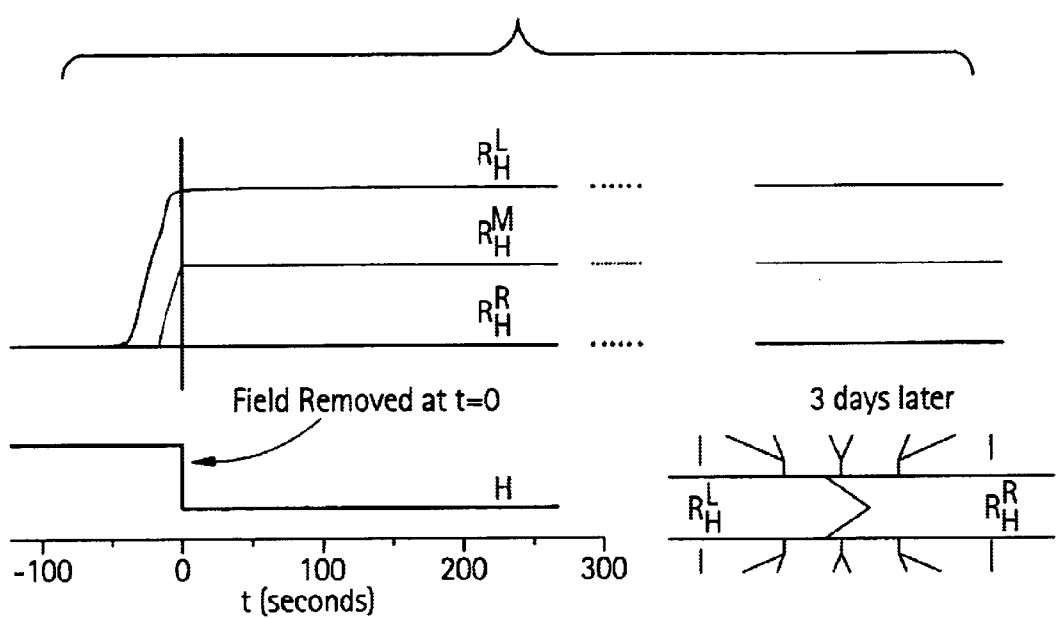

FIG. 8 shows an example of freezing of a single domain wall.

Figure 9:
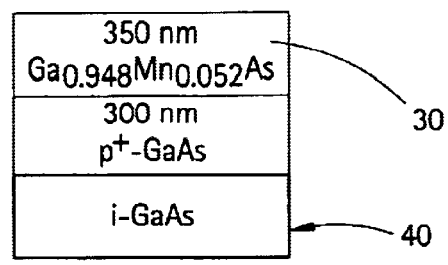

FIG. 9 shows a general starting heterostructure for use in forming devices according to the present invention.

Figure 10:
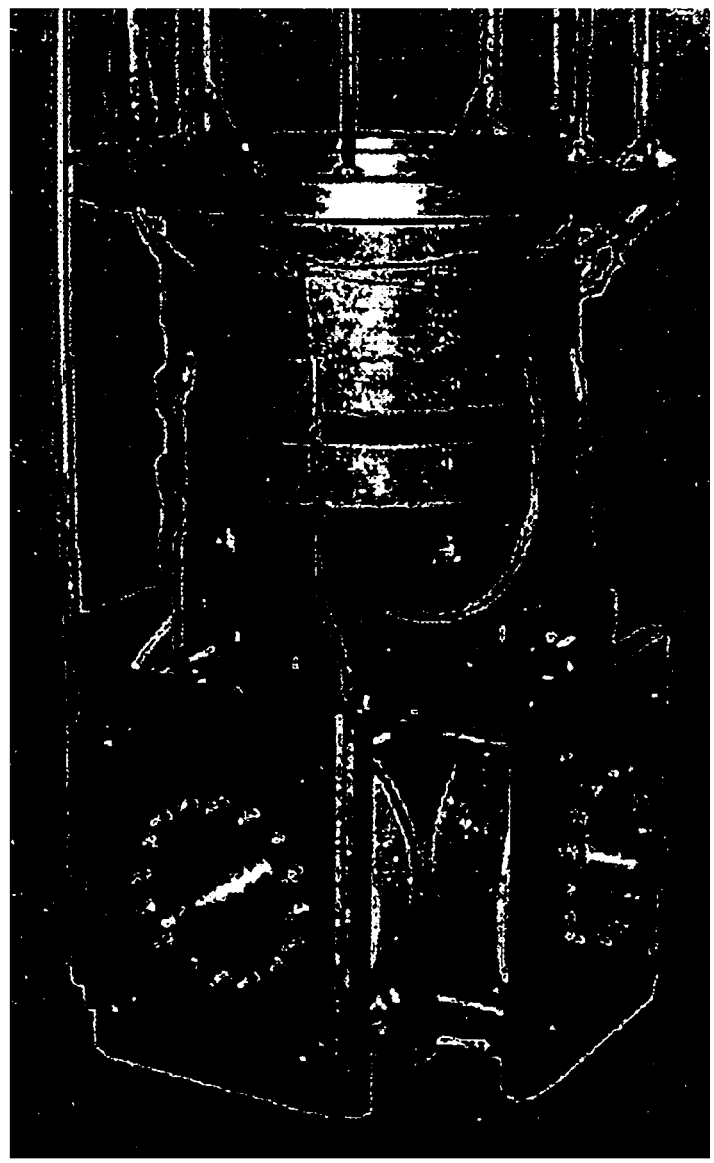

FIG. 10 shows an example of a magnet system for generating an applied magnetic field in any direction (3-D) without disturbing the sample (internal).

Figure 11:
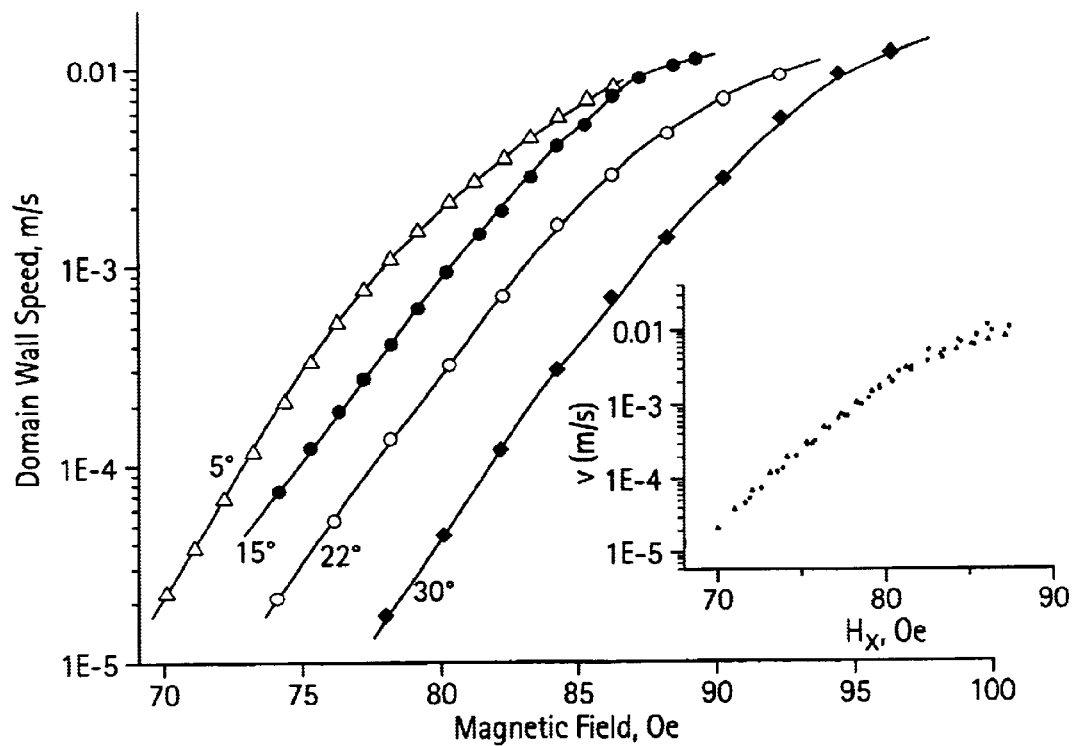

FIG. 11 shows a representative graph of domain wall velocity vs. magnetic field orientation (v-H curves). Angles are measured with respect to the longitudinal axis of the device. Inset: Domain wall velocity vs. field component along [110]. In the inset, data points of different angles condense onto on a single universal curve in the low field regime.

DETAILED DESCRIPTION OF THE INVENTION

Figure 1A:
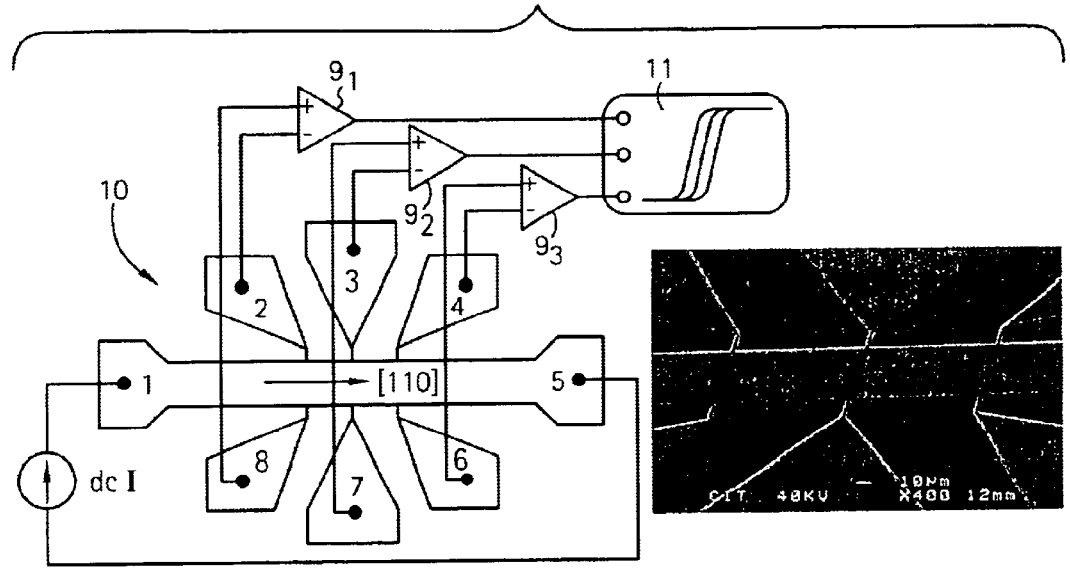
FIG. 1(a) shows a Hall device, including a measurement setup, according to an embodiment of the present invention.

FIG. 1(a) shows a Hall device 10, including a measurement setup, according to an embodiment of the present invention. FIG. 1(a) also shows an electron micrograph of a typical Hall device 10. As shown, device 10 is arranged similar to a standard Hall bar having electrical contacts 1 and 5 positioned at opposite ends of the longitudinal axis (as shown, the [110] direction). Three pairs of transverse (Hall) voltage probes are provided. For example, probes 2 and 8 make up a pair, probes 3 and 7 make up another pair, and probes 4 and 6 make up the third pair. Although three sets of probes are shown, it is appreciated that two sets may be used or that more than three sets may be used in certain aspects.

Device 10 is preferably formed using a ferromagnetic based semiconductor material. In one embodiment, epilayers of (Ga, Mn)As are formed on a GaAs substrate and patterned to form the device. In one aspect, for example, device 10 is fabricated by growing a $Ga_{1-x}Mn_xAs$ epilayer, e.g., 150 nm-thick $Ga_{0.948}Mn_{0.052}As$ epilayer, on top of an insulating GaAs buffer layer (substrate) by low temperature molecular beam epitaxy (MBE). Such epilayers are subsequently patterned into one or more standard Hall bars, each with the longitudinal axis (i.e., the direction of current flow) preferably oriented along the [110] direction (a cubic hard axis), and each including a desired number of voltage probes. For example, for mass production of such devices, the epilayers may be formed on a wafer and then patterned into the desired number of devices, with the wafer subsequently diced to separate the devices. Details of both the fabrication methods and the GPHE-based analysis of the magnetic properties of such ferromagnetic semiconductor devices, and in particular (Ga,Mn)As epilayer devices, are described later. It is appreciated, however, that different materials and material concentrations and thicknesses may be used without departing from the scope of the invention.

Returning to FIG. 1(a), in one aspect, the width of the Hall bar is approximately 100 µm, and each pair of voltage probes are separated by about 100 µm along the longitudinal axis. It should be appreciated that other dimensions and spacings may be implemented, and that the current dimensions and sizes depicted represent one particular embodiment and are used to simplify the description and analysis that follows.

Figure 1B:
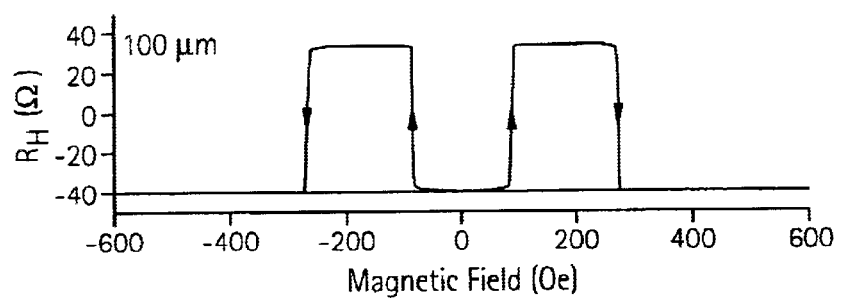
FIG. 1(B) shows a typical GPHE resistance vs. applied magnetic field (R-H) loop for the device of FIG. 1(a).

To avoid geometrical pinning of domain walls in their vicinity (see, J. Wunderlich et al., *IEEE Trans. Magn.* 37, 2104 (2001)), the probe widths are preferably minimized with respect to that of the channel (e.g., 100 µm). In one aspect, therefore, the probe widths are each approximately 3 µm. Dynamical measurements are carried out with a battery-supplied, constant dc drive current (e.g., 10 µA). Induced transverse voltages detected by the three voltage probe pairs are coupled (e.g., through triaxial cables) to three electrically-isolated, dc-coupled low noise differential amplifiers 9 providing, e.g., a 1 MHz signal bandwidth. A multichannel digital oscilloscope 11, or other signal processing and display system, enables simultaneous acquisition of voltage time records from the signal channels. During measurement, device temperature is preferably regulated, e.g., at values between about 0.3 K and about 45 K. After a domain wall is nucleated at one side of the bar, the wall propagates sequentially across the transverse probe sets, successively generating GPHE signal voltages. FIG. 1(b) shows a typical GPHE resistance (R) vs. magnetic field (H) loop for the device of FIG. 1(a). In one aspect, a 3-coil superconducting magnet system is used to generate the applied magnetic field (H), which can be rotated electronically in any direction under computer control. The magnet system, in one aspect, includes three orthogonal superconducting coils that allows for directing an applied magnetic field in any direction without physically disturbing the sample, e.g., device 10. FIG. 10 shows an example of such a magnet system. Such a 3-axis magnet device can be obtained from Oxford Instruments of Cambridge, UK. It will be appreciated that any system or mechanism capable of generating an applied magnetic field of desired magnitude(s) and direction(s) may be used.

It is known that (Ga,Mn)As films are intrinsically magnetized in-plane due to a combination of compressive lattice-mismatch-induced strain and demagnetization effects (see, e.g., H. Ohno, Science 281, 951 (1998)). A representative R-H loop (here R is the giant planar Hall resistance) as shown in FIG. 1(b) is obtained at T=5° K with an applied magnetic field (H) oriented 15° away from [110] and ramped at a rate of 15 Oe/s. The first resistance jump corresponds to a magnetization transition from [0$\bar{1}$0] to [100]; the second jump completes the reversal by switching from [100] to [010]. The square hysteresis loops obtained at low temperatures are indicative of magnetization switching dominated by wall motion, rather than domain nucleation. In (Ga,Mn)As, except for those directions precisely collinear with the easy axes, the magnetization transitions evolve via the formation of a 90°-domain wall. Here the focus is on time-domain studies of the first transition, which occurs sharply at a rather low switching field and involves initial and final states very close to those at equilibrium in zero field.

In certain aspects, a metastable magnetization state is induced within the sample, for example to facilitate domain wall propagation studies. This is achieved in certain aspects by first applying a strong in-plane magnetic field in a selected direction to saturate the magnetization, then smoothly ramping to a specific field magnitude with orientation antialigned to the initial saturation field. At the temperatures studied (e.g., between about 0.3° K and about 45° K), domain wall nucleation occurs infrequently through intrinsic stochastic processes. Once nucleated, the constant in-plane field drives growth of the domain possessing magnetization most closely aligned with the applied field. It is noted that domain wall motion induced in this manner always involves propagation from a wide current contact pad into the channel (see, e.g., K. Shigeto, T. Shinjo, T. Ono, Appl. Phys. Lett. 75, 2815 (1999)). With this protocol, completely reproducible signals are detected.

FIG. 2 shows the temporal evolution of domain wall propagation using the device of FIG. (1a), measured via a series of GPHE measurements at 5° K, for in-plane magnetic fields stepped between 74 Oe and 88 Oe. The three simultaneously-obtained time records (of GPHE voltage) reveal passage of a single domain wall sequentially along each of the transverse probe sets. At a given field, the three temporal waveforms have substantially identical magnitudes and transition (i.e., rise) times, but occur sequentially. The time delays between their onsets at successive channels are substantially identical given the constant inter-probe spacing (e.g., 100 μm). These data are consistent with the picture that domain walls propagate along the device while retaining a fixed shape. Domain wall velocity can therefore be extracted by measuring the time-of-flight between transverse probe sets.

Figure 2A:
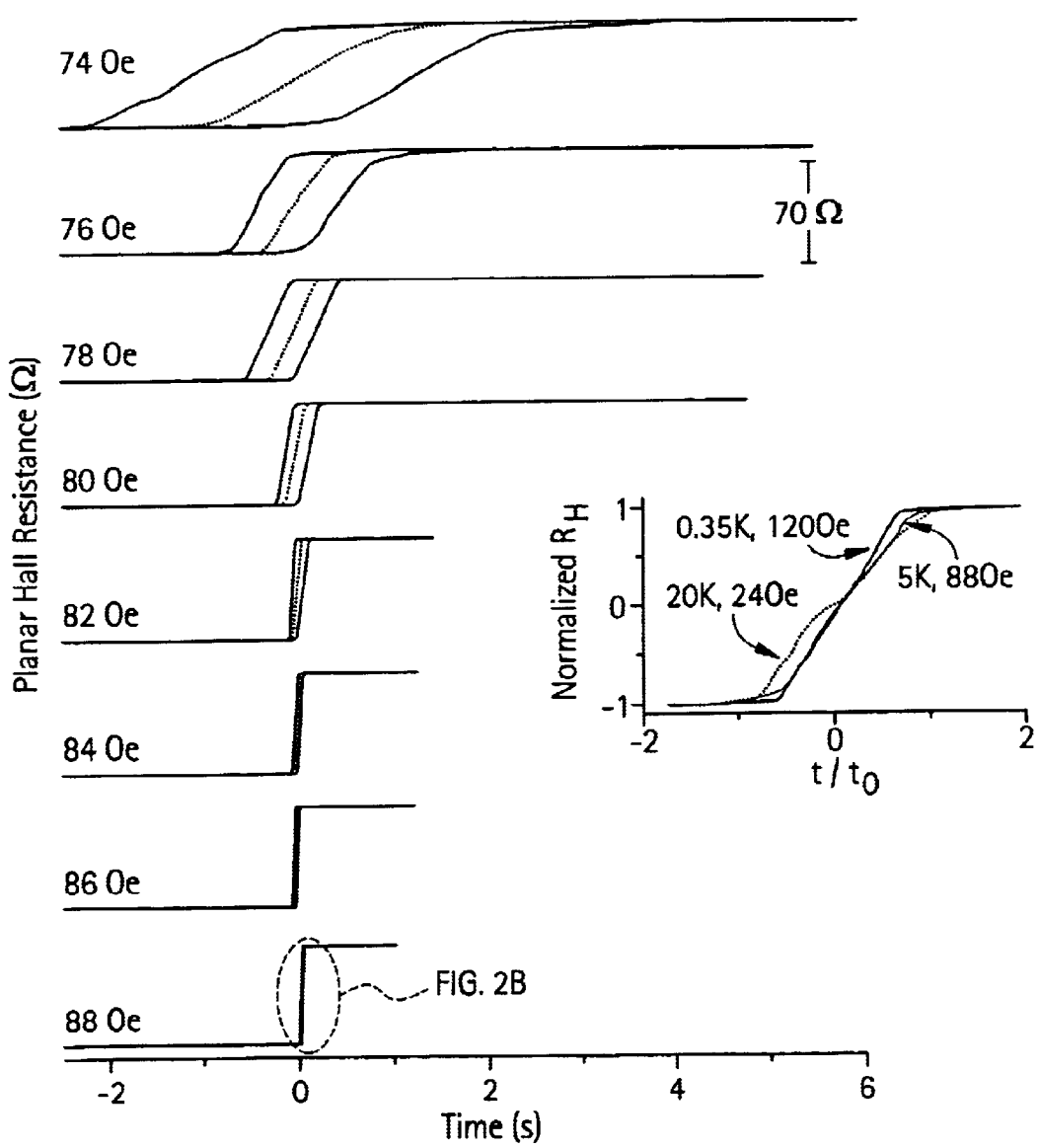
FIG. 2(a) shows a comparison of resistance switching curves for T=0.35K, 5K, and 20K. The horizontal axis value is normalized to time-of-flight between adjacent probes, whereas the vertical axis is normalized by half the asymptotic jump height. Inset
Figure 2B:
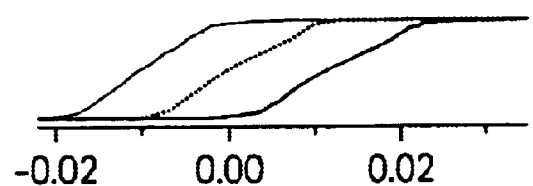
FIG. 2(b) shows a magnified view that demonstrates the fast dynamics occurring at 88 Oe.
Figure 2C:
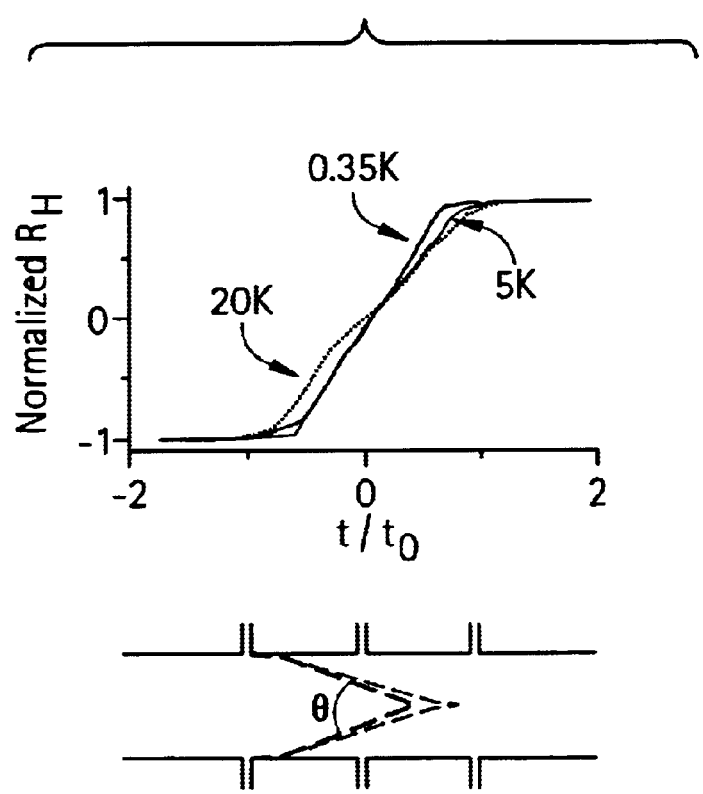
FIG. 2(c) shows an estimated domain wall profile corresponding to inset FIG. 2(a).

During each of the transitions, the transverse voltage varies almost linearly with time (FIG. 2(a)). This is evident at both limits, i.e., for very fast (88 Oe, FIG. 2(b)) and for very slow (74 Oe) domain wall motion. However, above T=4° K, extended tails are evident at the initial and final stages of the reversal. These tails become progressively suppressed as temperature is decreased, and almost entirely disappear at the lowest measurement temperature (−0.35K). There, the ratio of the transition time and the propagation time between neighboring transverse probes (the delay between their respective signal onsets) is about 1.4±0.2. This indicates that the domain wall extends longitudinally 140 μm±20 μm along the Hall bar. The persistence of a nearly linear temporal evolution over the range 4 K<T<25 K suggests domain wall shape does not change markedly at elevated temperatures. FIG. 2(c) shows an estimated domain wall profile corresponding to inset FIG. 2(a).

Figure 3:
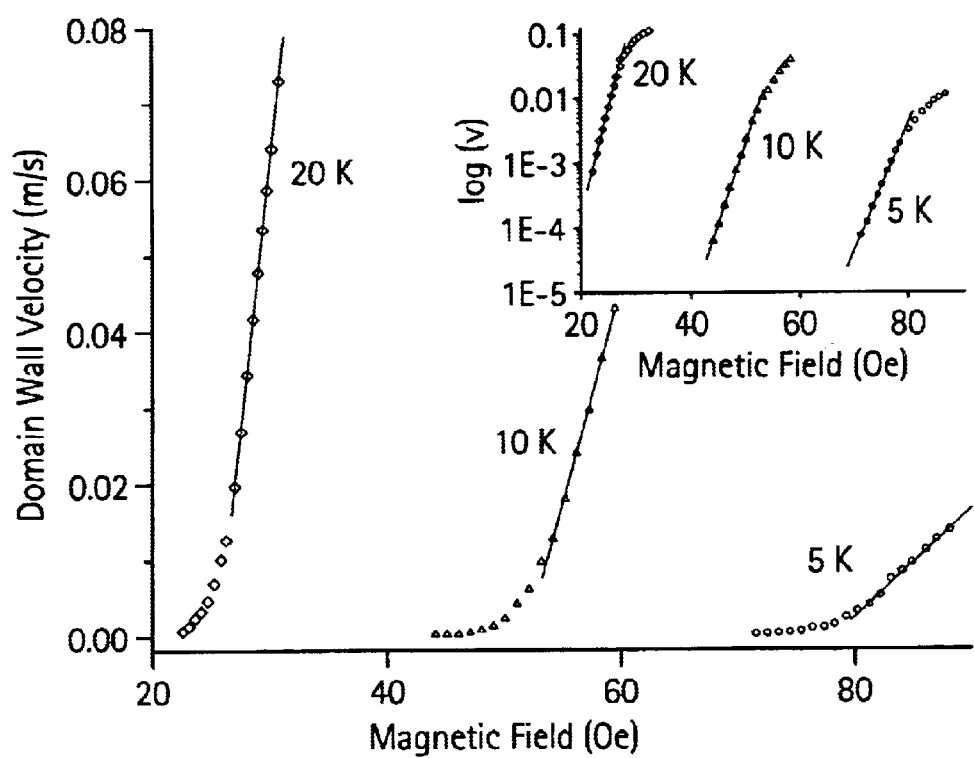
FIG. 3 shows the measured dependence of domain wall velocity on applied in-plane field for temperatures of 5°, 10° and 20° K, displayed in linear and semi-logarithmic formats (inset). The external field is orientated 15° away from [110]. In the linear plot, solid lines represent fits to the high field velocities. In the semi logarithmic plot (inset), solid lines are linear fits to the low field region.

Below 25° K, the data indicate that magnetization reversal proceeds through infrequent nucleation of single domain walls within one of the (large) current contacts, followed by uniform propagation through the device channel. Above 25° K, however, multiple local domain wall nucleation appears to dominate the magnetization reversal process, and the time of flight method is not applicable. (Data not shown) FIG. 3 shows the measured dependence of domain wall velocity on applied in-plane field for temperatures of 5°, 10° and 20° K, displayed in linear and semi-logarithmic formats (inset); over this range the velocity spans four decades. Measurements were taken with the external applied field (H) oriented 15° away from [110]. In the linear plot, solid lines represent fits to the high field velocities. In the semi logarithmic plot, solid lines are linear fits to the low field region.

The v-H curves exhibit highly nonlinear dependence upon in-plane magnetic field. This behavior can be divided into two distinct regimes. For driving fields H larger than a specific threshold $H_0$ (essentially the intrinsic coercive field), the influence of disorder-induced domain wall pinning can be ignored. In this case, a linear v~H relation is obtained that is characteristic of viscous flow. In this regime the wall velocity can be expressed as:

$$v = \mu(H - H_0) \tag{1}$$

where μ is the domain wall mobility (see, e.g., T. H. O'Dell, *Ferromagnetodynamics: the dynamics of magnetic bubbles, domains, and domain walls* (John Wiley & Sons, New York, 1981)). This mobility varies strongly with temperature; the data shows the mobility increasing from 1.4 mm/s.Oe at 5° K to about 14 mm/s.Oe at 20° K. These results are summarized in Table I. below.

TABLE I

Characteristic parameters determined for (Ga, Mn) As in two field regimes.

| Temperature (K.) | Mobility (mm/s · Oe) | $H_0$ (Oe) | α ($Oe^{-1}$) | $V_N^{1/3}$ (nm) |
|---|---|---|---|---|
| 5 | 1.39 | 79.8 | 0.185 | 18.2 |
| 10 | 6.11 | 52.1 | 0.260 | 26.5 |
| 20 | 14.2 | 24.8 | 0.342 | 37.4 |

The temperature dependence of the domain wall velocity is of importance because it can yield information about the source of spin damping in the magnetic system. On reducing the magnetic field well below $H_0$, domain wall velocity in the system decays dramatically. The data in this regime are best fit by a thermally activated depinning model (see, e.g., M. Laurune, S. Andrieu, F. Rio, P. Bernstein, *J. Magn. Magn. Mater.* 80, 211 (1989)), $$v \propto \exp[(H \cdot \Delta M V_N - E_p)/k_B T] \propto \exp[\alpha(H\cos\phi_H - H_0)] \quad (2)$$

Here $E_p$ is the activation energy for domain wall propagation, $V_N$ is the activation volume, $\Delta M = M_2 - M_1$ (with $M_1$ representing the initial magnetization (close to $[0\bar{1}0]$) and $M_2$ the magnetization after switching (close to $[100]$) ), $\phi_H$ is the magnetic field orientation and $\alpha = M_S V_N/k_B T$ (here $M_S$ represents the saturation magnetization of (Ga,Mn)As). From the low-field slopes of the semi-logarithmic curves (FIG. 3, inset) the activation volumes for different temperatures (displayed as a linear dimension, $V_N^{1/3}$, in Table I.) are estimated.

Investigating the v-H curves along various sweep angles further confirms the validity of Eq. 2. The dependence of domain wall velocity on applied field, $\phi_H$, swept along 5°, 15°, 22° and 30° orientations has been measured. FIG. 11 shows a representative graph of domain wall velocity vs. magnetic field orientation (v-H curves). The resulting data coalesce onto a single universal curve (FIG. 11 inset) in the low field region upon scaling the magnetic field by $\cos\phi_H$. This demonstrates that it is solely the field component along [110] that is effective for driving domain wall motion.

It is useful to compare the present approach to other methods for investigating domain wall dynamics. Existing GMR-based techniques, for example, involve resistance measurements which reflect global changes in the growth (i.e. volume expansion) of domains, integrated over the entire sample (see, e.g., T. Ono et al., *Science* 284, 468 (1999)). By such an average approach it is not possible to track the spatial propagation of an individual domain wall "wavefront", as is demonstrated herein. By contrast, use of separate transverse probes advantageously allows for the local evolution of the domain wall to be followed in real time, with high spatial resolution. Furthermore, extremely high sensitivity is achieved through the (four-probe) circumvention of what would otherwise be a large (two-probe) background resistance.

According to one aspect, individual domain walls are manipulated, directly and reproducibly, by controlling the external field. For example, once a domain wall is detected between probes, it can be "frozen" inside the channel by quickly removing the external field. The domain wall then decelerates virtually instantaneously, and remains stationary thereafter for as long as needed. Domain wall motion can subsequently be resumed by reapplication of an in-plane field. This ability to entrap a single domain wall between probes enables the directly characterization of the electrical resistivity of an individual entity. FIG. 8 shows an example of freezing of a single domain wall. The domain wall is driven at a slow speed and the planar Hall resistance of the central probes is monitored to reflect the passage of the domain wall. The crossing-zero of this signal triggers the removal of external magnetic field. The domain wall is found to remain stationary. In one aspect, this is achieved quasistatically. First, the in-plane driving field is adjusted so that, once nucleated, a solitary domain wall propagates very slowly across the sample (~100 s delay between successive probes). Then, during its traversal high resolution measurements of two distinct longitudinal resistances, termed $R^U$ and $R^D$, are obtained via a.c. lock-in techniques (e.g., 79 Hz drive, 30 ms integration time). These involve either a pair of voltage probes on the top side of the device, $R^U = R_{15,24}$ or a pair on the bottom, $R^D = R_{15,86}$. (Here, conventional four-probe notation is used; $R_{ij,kl}$ corresponds to driving current from terminal i to j, and measuring the potential induced from k to l.) Simultaneously, the Hall resistances obtained from the left and right transverse probes ($R^L = R_{15,28}$, $R^R = R_{15,46}$) are measured to monitor the arrival and departure of the domain wall from the "measurement region" between these probes. FIG. 4(a) shows GPHE signals from two pairs of transverse probes that monitor the arrival and departure of a single domain wall from the "measurement region" between the probes. In certain aspects, the concomitant time records of these four resistances ($R^U$, $R^D$, $R^L$ and $R^R$) are obtained by digitally sampling the averaged analog output from four separate lock-in amplifiers, collectively synchronized to a common reference. In one aspect, bridge circuits are utilized to null the large static background in the two longitudinal resistance measurements.

FIG. 4(b) displays the change in longitudinal resistance resulting from entrapment of a single domain wall in the measurement region at 5° K. A perturbation as large as 0.6% (~30Ω) is manifested. However this should not be literally interpreted as the intrinsic contribution from an individual domain wall. Because of the presence of the domain wall, both $R^U$ and $R^D$ comprise an admixture of longitudinal and Hall resistance. The latter, i.e. the GPHE signal, is predominant, and contributes a term with sign that is dependent on the direction of wall propagation. Precise extraction of the domain wall resistance from the overall magnetoresistance requires self-consistent simulation of the local current distribution. This is problematic; the exact shape of domain wall and the potential profile around it, are unknown. Instead, in certain aspects, an operational approach is taken, such as for example, averaging the measured longitudinal resistances, $<R> = (R^U + R^D)/2$, in effect, to compensate the GPHE contribution to first order. FIG. 4(d) shows the average, $<R> = (R^U + R^D)/2$. These compensated data indicate that the domain wall induces non-uniform eddy-like currents upon entering or leaving the measurement region, resulting in an observable perturbation, of order of 0.2% of the resistance background. These eddy-like currents are local, static variations in current density that arise from the resistivity discontinuity across the domain wall (see, L. Berger, *J. Appl. Phys.* 49, 2156 (1978)); they do not originate from the dynamics of domain propagation. However, when the domain wall is completely localized between these probes, $<R>$ clearly settles to reflect what appears to be the true contribution to the resistivity from a single domain wall. This is manifested in the central, linear feature within the trace of FIG. 4(d), which has two salient elements. The first, a linear evolution of the sheet resistance in this region, is interpreted as reflecting the fractional contributions from the two domains present—these change smoothly as the domain wall traverses the measurement region. (These two domains possess different resistivity, represented in the asymptotic values attained by $<R>$). The second, a small negative offset from the interpolated value in this locale, roughly −0.44Ω, is significant and appears to directly reflect the contribution from the single domain wall localized between the probes. Although completely reproducible, and well within measurement resolution (−0.1Ω), this offset is comparable to the accuracy of the background interpolation, which is estimated to be about 1 part in 10,000 of $<R>$, or ~0.5 Ω. These conclusions are supported by data at other temperatures as shown in FIG. 4(e).

Irrespective of its precise value, the resistance of an individual domain wall in (Ga,Mn)As epilayers is exceedingly small. If it is finite, its value appears to be negative and less than 0.01% of the sheet resistance of the (Ga,Mn)As epilayers. Measurements of single domain wall propagation and magnetoresistance within patterned (Ga,Mn)As conductors possessing in-plane magnetization have been performed. The techniques of the present invention are applicable at temperatures down to the millikelvin range, where thermal fluctuations cannot overcome domain wall pinning and macroscopic quantum tunneling (MQT) of spatially-extended domain walls should be manifested.

Fabrication and Analysis

Semiconductor ferromagnetism also gives rise to new physical phenomena because it is possible to engineer, and enhance, spin-orbit coupling in ways that are not possible in metallic systems. According to the present invention, a giant planar "Hall" effect (GPHE) in ferromagnetic semiconductor devices, e.g., epitaxial (Ga,Mn)As thin film devices, is one such engineered effect. The GPHE is manifested as a spontaneous transverse voltage that develops, because of spin-orbit coupling, in response to longitudinal current flow in the absence of an applied field. Analogous effects studied in metallic ferromagnets are exceedingly small—typically of order mΩ (see, e.g., K. Hong and N. Giordano, *Phys. Rev. B* 51, 9855 (1995).). Related phenomena have recently been investigated in ferromagnetic semiconductors (see, e.g., H. Ohno et al., *Science* 281, 951 (1998).), but herein the previously unrecognized, and quite remarkable, response of the GPHE to an applied in-plane magnetic field is disclosed. Within the high quality, single domain ferromagnetic semiconductors of the present invention, a switchable effect is produced that is about 4 orders of magnitude stronger than found in metallic ferromagnets. Below, measurements that take advantage of this strong GPHE provide insight, and unprecedented resolution, into the mechanism of magnetic switching within these materials. These data, in turn, enable complete characterization of the magnetic anisotropy of the ferromagnetic semiconductor structure, e.g., (Ga,Mn)As epilayers. Without being limited to one particular theory, it is believed that this phenomenon stems from the combined effects of significant spin-orbit coupling in the valence band of the zinc blende crystal structure, and the large spin polarization of holes in (Ga,Mn)As. The temperature dependence of the magnetization and the coercivity determined by electrical measurement should provide additional insight into the underlying physical mechanisms.

In one aspect, GaMnAs epilayers are formed on a GaAs substrate. The epilayers are thereafter, or concurrently, patterned using conventional techniques to form the device of interest, e.g., Hall bar device 10 of FIG. 1. Voltage probes are also formed as desired using conventional fabrication techniques. In one preferred aspect, molecular beam epitaxy at 250° C. is used to deposit 150-nm-thick $Ga_{0.948}Mn_{0.052}As$ epilayers on top of an insulating GaAs(001) substrate with a buffer layer. It should be appreciated that other formation techniques may be used, such as for example, chemical vapor deposition (CVD) techniques. Various thicknesses and concentrations of materials have been investigated. In certain aspects, samples are annealed at elevated temperatures. The devices described herein are patterned from a single wafer (UCSB-001115A, Curie temperature $T_c$~45 K); however, it is notable that all devices studied (fabricated from a variety of different epilayers) exhibit consistent behavior. It should also be appreciated that other concentrations and thicknesses of materials may be used, and that other materials may be used. For example, in certain preferred aspects, GaMnAs epilayers having a Mn concentration of between about 1% to 8%, and more preferably between 1% and 7%, and having a preferred thickness of between about 10 nm and about 350 nm, and more preferably between about 100 nm and about 350 nm are used. Additionally, any III–V type semiconductor materials and others may be used, such as, for example, Mn doped GaN (e.g., $Ga_{1-x}Mn_xN$) epilayers on a GaN substrate.

In one aspect, a general starting heterostructure is shown in FIG. 9. In certain aspects, a ferromagnetic epilayer 30 is formed on a substrate layer 40 using conventional techniques such as low temperature molecular beam epitaxy (MBE), chemical vapor deposition (CVD), etc. In one aspect, when using (Ga,Mn)As, because (Ga,Mn)As is heavily p-doped, a Be doped GaAs layer (e.g., buffer layer) is used asp-type conducting channel. In preferred aspects, substrate 40 is doped to form the buffer layer, however, the buffer layer may be formed using alternate techniques such as by deposition or epitaxy. Examples of useful Be doping levels include between $1\times10^{19}$ cm$^{-2}$ and $1\times10^{18}$ cm$^{-2}$. The contacts between (Ga,Mn)As and GaAs:Be are ohmic for this range of concentrations. Compared to n-type semiconductors (i.e., those with electronic conduction), ohmic contact to p+GaAs:Be is easy to achieve and alloying is usually not needed. Alternatively, a separate buffer layer may be formed on the substrate 40, using conventional techniques appropriate for the desired buffer layer material(s).

After cleaving and etching the heterostructure using techniques as are well known, Ti/Pd/Au/Ti metal layers are deposited, e.g., via electron beam lithography and lift-off techniques, to produce voltage probes and to define one or more micro-scale bars (e.g., device/bar 10) at various separations. For example, a single continuous deposition process may be used to deposit TI—Pd—Au—Ti layers in succession. The remaining description will reference two or more micromagnet structures. The widths and aspect ratio of these bars may be made different to yield micromagnets with slightly different coercivities after subsequent ion-mill etching (e.g., using metallic layers as self aligned mask). Alignment marks are also put down to assist the fabrication of the remaining layers. In certain aspects, an etch is performed. The etch is calibrated to completely remove all the top (Ga,Mn)As epilayers and additional 50 nm–100 nm into p-type paramagnetic GaAs layers. Therefore, except for those isolated areas under metal masking layers, no continuous ferromagnetic epilayers exist on the chip, and the p-type conducting GaAs layers are exposed. Using another electron beam lithography and lift-off step, a thick Ti layer is defined and employed as an etching mask to form—p-GaAs conduction channel that connects both micromagnets. Conventional photolithography processes allow for the deposition of same thickness Ti masking layer for large contacts and for leads connecting to the p-GaAs channel in the center. Mesa isolation may also be achieved by ion-beam etching. Because of its excellent repeatability, ion-beam etching is preferred for (Ga,Mn)As device fabrication. Note that for this material, ion beam induced damage will be of less concern. The Ti masking layer is then removed, e.g., using diluted HF. The bottom thin titanium layer adhering to magnets is basically untouched since it reacts with Pd and tends to heavily dope the GaAs in that vicinity. In one aspect, a final composite Pd/Ti/Pd/Au layer may be patterned to make contacts to both p+GaAs and micromagnets (with Ti/Pd/Au on top), e.g., through combined electron beam lithography (EBL) and photolithography (PL). In this aspect, the whole process involves three EBL and one PL steps, four thin film depositions steps, and two ion-beam etching processes.

In certain aspects, magnet widths of between about 1,000 $\mu$m (or greater) and about 0.1 $\mu$m (or smaller), preferably between about 100 $\mu$m and about 0.5 $\mu$m, and more preferably between about 0.75 $\mu$m and about 0.5 $\mu$m are made. The resistance between the pads of the ferromagnet and p-GaAs pads are in the range of 10 kΩ to 50 kΩ, in a few cases above 100 kΩ. Most of the resistance is present at the metal/(Ga, Mn)As interface, whereas the resistance across (Ga,Mn)As/ GaAs interface is very small. Further optimization of the fabrication may be required to obtain consistent small contact resistances between metal and p+GaAs.

Magnetoresistance measurements have been carried out on families of Hall bars (e.g., widths ranging from 6 μm to 1 mm) and square van der Pauw devices (e.g., (3×3) mm² devices). The former are aligned along the [110] direction by a combination of photo- and electron-beam lithography. Voltage probes on the Hall bars are carefully designed to minimize their perturbation upon current flow within the devices (see, e.g., scanning electron micrograph (SEM), FIG. 5(e)). Standard four-probe lock-in measurements are performed by a 10 nA ac sensing current at 14 Hz; excitation is intentionally kept quite low to obviate electron heating. Magnetic fields are generated using a three-coil superconducting magnet that allows 3D field orientation without physically disturbing the sample. Two classes of experiments were conducted. In the first, the applied magnetic field orientation is fixed in-plane along a specific direction, $\phi_H$, with respect to the longitudinal axis of the Hall bars, while the field magnitude is swept linearly between ±1000 Oe. In the second, the magnitude of the applied in-plane field is fixed, while stepping its orientation clockwise or counterclockwise. Prior to each sweep, an in-plane field of approximately 6000 Oe is applied to saturate the sample magnetization, M.

At all angles, except for those along [110] directions, two abrupt jumps are observed in GPHE measurements. Data taken for various Hall bar devices spanning from 6 μm to macroscopic (1 mm) dimensions (width) are shown in FIGS. 5(a)–5(c). These are obtained for orientation $\phi_H$=20° away from [110]. For comparison, the field-dependent sheet resistance of a 100 μm Hall bar is also displayed in FIG. 5(d).

Four distinct features emerge. First, large switching events at distinct magnetic fields are observed in the Hall resistance; these are accompanied by small jumps (relative to the background) in the longitudinal resistance. Second, between these switching fields, the planar Hall resistance remains substantially constant at approximately 37Ω. The signal polarity reverses at each switching event. Third, the switching fields are substantially independent of sample size and geometry. Measurements on samples with square, van der Pauw geometry, as large as (3×3) mm², exhibit identical switching behavior as those of the smaller, micron-scale devices—even though the magnitude of the Hall resistance is reduced in the former, presumably due to nonuniform current distribution. Fourth, when the width of the Hall device is reduced to about 6 μm, small Barkhausen jumps are observed. These occur in close proximity to the switching transitions as shown in FIG. 5(f), and demonstrate that the propagation of domain walls is constrained by geometry (see, e.g., J. Wunderlich et al., *IEEE Trans. Magn.* 37, 2104 (2001); T. Ono et al., *Science* 284, 468 (1999).).

Hall bars fabricated along many other directions besides the [110] crystalline axis were also investigated. It was found that that the switching fields do not depend on the orientation of the Hall bars, whereas the magnitude of planar Hall resistance jumps is systematically reduced as the orientation moves away from the (110) directions.

FIG. 6(a) shows the dependence of R-H loops upon field orientation angle $\phi_H$ as it is varied from −30° to 30° in the plane of the device. In the field range of these experiments, only one jump occurs along the (110) directions. Away from these special orientations, a two-jump reversal is always observed. The first switching field $H_{c1}$ is almost constant, while the second switching field $H_{c2}$ decreases dramatically and approaches $H_{c1}$ at around ±30°.

Without being limited to one particular theory, the jumps in the Hall resistance are described as follows. The electric field within a single domain ferromagnetic film with in-plane magnetization can be written as:

$$E_x = jr^\wedge + j(rP - r^\wedge)\cos^2 j \quad (1)$$

$$E_y = j(rP - r^\wedge)\sin j \cos j. \quad (2)$$

where the current density j is assumed to be uniformly distributed along the Hall bar, x and y are the longitudinal and transverse axes, and $\phi$ is the angle between the magnetization and current density j. r P and r^ are the resistivities for current oriented parallel and perpendicular to the magnetization. (see, J. P. Pan, *Solid State Physics*, edited by F. Seitz and D. Turnbull (Academic, N.Y., 1957),Vol. 5, p. 1–96.) The anisotropic magnetoresistance phenomenon is described by Eq. (1). The transverse resistance, i.e., the planar Hall resistance, is expressed in Eq. (2), which exhibits extrema at $\phi$=45° and its cubic equivalents. To verify this angular dependence of the planar Hall resistance, an in-plane field of constant magnitude 6000 Oe is applied to saturate the magnetization, and its orientation is swept through 360°. FIG. 6(c) shows the planar Hall resistance measurements for a series of fixed-magnitude sweeps of magnetic field orientation at different (fixed) magnitudes. In accordance with Eq. (2), the measured Hall resistance exhibits extrema for applied field orientations of about 45°, about 135°, about 225°, and about 315°. Note that the first maximum of planar Hall resistance appears at 135° instead of 45°, indicating r P−r^<0 [−73 Ω from Eq. (2)]. This property of (Ga,Mn)As is distinct from that in conventional ferromagnetic metals, where r P−r^>0. It may originate from the different manner in which holes and electrons contribute to the spin-orbit interaction in ferromagnetic materials.

The anomalous switching behavior of the Hall resistance shown in FIGS. 5(a)–5(c) can be explained by a two-jump sequence of magnetization: [100]($\phi$~−45°)→[010]($\phi$~45°) [100]($\phi$~135°). This evolution also accounts for the accompanying small longitudinal resistance jumps shown in FIG. 5(d). Between the switching events, the sample remains in what appears to be a macroscopic single domain state. In this regime the magnetization evidently rotates coherently according to the Stoner-Wohlfarth model (see, E. C. Stoner and E. P. Wohlfarth, *Philos. Trans. R. Soc.* London A *240, 74* (1948).); hence, the planar Hall resistance continues to evolve to a small degree with the field. Scanning SQUID microscopy of (Ga,Mn)As epilayers magnetized in-plane have provided evidence for the existence of macroscopic single domains on length scales extending to hundreds of microns (see, e.g., T. Fukumura et al., *Physica* (Amsterdam) 10E, 135 (2001).). Domain states within the sample exist only in the vicinity of the switching field, and the associated domain wall scattering evidently generates the remarkable resistance spikes shown in FIG. 5(d).

FIG. 6(b) summarizes the signatures of the coercive fields manifested in the electrical transport measurements. The field loci delineating the resistance transitions are shown in polar coordinates. The $H_{c1}$ lines form a rectangular shape, whereas the $H_{c2}$ lines are more complicated. The latter follow the extrapolation of $H_{c1}$ lines at low field but evolve towards the (110) axes in higher fields. Eventually, at a field around 2500 Oe, the second jump becomes smeared and reversible. These measurements clearly elucidate behavior that is generic in these (Ga,Mn)As epilayers: the in-plane magnetic anisotropy is nearly cubic, but it is biased by a small twofold preference along [110].

Unusual multiple switching, somewhat analogous to that demonstrated herein, has also been observed in ultrathin epitaxial Fe films, through the magneto-optic Kerr effect. A switching pattern analogous to that of FIG. 6(b) was measured in a Ag/Fe/Ag(001) system by Cowburn et al. (see, R. P. Cowburn et al., *J. Appl. Phys.* 78, 7210 (1995).), although with significantly less resolution in their metallic system. To explain their results, a simple model is invoked incorporating a well-defined domain wall pinning energy into a complex, anisotropic magnetocrystalline energy surface. (A weak in-plane uniaxial anisotropy is superimposed along one easy axis of a strong cubic anisotropy.) The present experimental data can be explained via similar domain reversal energetics, but in the present case the in-plane uniaxial easy axis is collinear with a hard axis of the cubic anisotropy. The corresponding free energy density of such a single domain magnet can be written as $E = K_u \sin^2\phi + (K_1/4)\cos^2 2\phi - MH \cos(\phi - \phi_H)$. Here, $K_u$ and $K_1$ are in-plane uniaxial and cubic anisotropy constants. The equilibrium state is defined by the conditions, $\partial E/\partial \phi = 0$ and $\partial^2 E/\partial \phi^2 > 0$. The former gives $$K_u \sin 2j - K_1 \sin 4j + MH \sin(j - j_H) = 0 \qquad (3)$$

At zero field, four distinct magnetization states, corresponding to four local energy minima, can exist:

$$j^0_{1,2} = \pm(p/4 = d), \quad j^0_{3,4} = \pm(3p/4 + d),$$

with $d = \sin^{-1}(K_u/K_1)$. Domains can exist over short length scales in a demagnetized thin film. Upon application of an in-plane field, these small-scale domains quickly become suppressed, and the whole sample evolves into a macroscopic single domain state with $\phi$ close to 1 of the zero fields minima $$j^0_{1-4}.$$

When the external field is reversed, magnetization reversal is achieved via an intermediate state corresponding to the sample magnetization oriented almost orthogonally (90°) to the initial and final directions of the magnetization. Domain states mediate the transitions from one energy minimum to another. For a domain wall to become liberated to propagate through the sample, the reversed external field must be increased to the point where a characteristic pinning energy density, $\in$, is exceeded, i.e., $H_c \cdot (M_2 - M_1) = \in$. Here $M_1; M_2$ are the initial and final magnetization, and $H_c$ is the switching field. If $H_c$ is small compared to the cubic anisotropy field, coherent rotation of $M_1$ and $M_2$ from the zero-field equilibrium is negligible. For transitions from [100] to [010], a ~90° domain wall with core magnetization along [110] is required to propagate across the sample, giving $H_c x_{\hat{x}} = -\in_{110}/2M \sin(45°-d)$, in which $\in_{110}$ is the corresponding domain wall pinning energy density. Considering all possible orientational trajectories, the loci of transitions can be described as $H_c x_{\hat{x}} = \pm \in_{110}/2M \sin(45°-d)$ and $H x_{\hat{y}} = \pm \in_{110}/2M \times \sin(45°-d)$. At low field, these describe two parallel sets of lines that are in excellent correspondence with the switching pattern observed in the experiments as shown in FIG. 6(b). At high fields, two new pieces of physics become important. First, coherent rotation of M must be considered and, second, the energy density of a domain wall also becomes significantly reduced (see, A. Hubert and R. Schafer, *Magnetic Domains: The Analysis of Magnetic Microstructures* (Springer-Verlag, Berlin, 1998), p. 235.). As a result, high field transitions progressively evolve towards the (110) directions.

Several additional points should be noted. First, PHE measurements enable determination of crystallographic orientation with remarkable precision; the angular error in establishing the (110) crystalline axes is estimated to be less than 0:04°. Second, apart from the singularity along these (110) directions, neither single transitions nor three-transition processes are observed. This justifies an assumption that in-plane uniaxial anisotropy does not exist along the cubic easy axes (see, R. P. Cowburn, et al., *Phys. Rev. Lett.* 79, 4018 (1997).).

Both the cubic and uniaxial anisotropy fields can be deduced through PHE measurements. In one aspect, to achieve this, a large, constant magnetic field is applied in the plane while its orientation is rotated continuously. FIG. 6(c) shows data from such measurements for clockwise and counterclockwise sweeps of magnetic field orientation, for several different field magnitudes. When $H < H_{cA}$, where $H_{cA} \sim 2500$ Oe is the dominant cubic anisotropy field, the magnetoresistance reverses each time the magnetization switches across the cubic hard axis. The planar Hall resistance becomes reversible for fields greater than 2500 Oe, in which case the magnetization rotates coherently according to the Stoner-Wohlfarth model. Thus, for a given external field angle $\phi_H$, the macroscopic in-plane magnetization orientation, $\phi$, can be calculated by using the expression in Eq. (2). Fitting all the computed data sets ($\phi_H; \phi$) to Eq. (3), the anisotropy fields $H_{cA} = 2K_1/M = 2400$ Oe, $H_{uA} = 2K_u/M = 160$ Oe are consistently and unambiguously extracted.

Progress has recently been made toward gaining a theoretical understanding of magnetic anisotropy in III-V magnetic semiconductors (see, e.g., T. Dietl et al., *Phys. Rev.* B 63, 195205 (2001); T. Dietl et al., *Science* 287, 1019 (2000).; M. Abolfath et al., *Phys. Rev.* B 63, 054418 (2001); J. Konig, T. Jungwirth, and A. H. MacDonald, *Phys.Rev.* B 64, 184423 (2001).). It is generally agreed that, in addition to an intrinsic cubic anisotropy, (Ga,Mn)As possesses a substantial out-of-plane uniaxial component with sign that is dependent on whether tensile or compressive biaxial strain exists at the interface (see, H. Ohno et al., *Science* 281, 951 (1998).). While attention has focused almost exclusively on the out-of-plane magnetic anisotropy, recent work on (Ga,Mn) As magnetic tunnel junctions (see, M. Tanaka and Y. Higo, *Phys. Rev. Lett.* 87, 026602 (2001)) highlights the importance of the in-plane anisotropy. On the other hand, theoretical models of cubic anisotropy predict that the in-plane cubic easy axes can be oriented along either (100) or (110) depending upon the hole concentration and the degree of spin splitting. By contrast, all of the data taken on a variety of (Ga,Mn)As epilayers as described herein indicate that the cubic easy axes are aligned along (100) axes. Further PHE studies on additional epilayers may be needed to determine if the cubic anisotropy exhibits the variations predicted by theory. The experimental results do agree, however, with the predicted magnitude of the cubic anisotropy field, which is found to be about 2400 Oe.

The temperature dependence of PHE has also been studied. The temperature dependence should be of significant importance in elucidating the underlying physical mechanisms. FIG. 7(a) shows the results for a 10 µm Hall bar device, measured under conditions of careful temperature regulation, stepped downward from 50 to 0.32 K, for fixed-orientation, swept-magnitude, applied magnetic fields. The magnitude of both PHE and the coercive fields increases rapidly with decreasing temperature as shown in FIG. 7(b). For T<10 K, both the PHE and sheet resistivity diverge logarithmically down to the lowest measured temperatures, while the ratio $\Delta R_H/R_\square$ remains nearly constant. Here, $\Delta R_H$ is the PHE resistance jump and $R_\square$ is the zero-field sheet resistance. This ratio, $\Delta R_H/R_\square$, provides valuable information about the hole spin polarization, which has been found to decrease monotonically with increasing temperature, qualitatively tracking the magnetization of a (3×3) $mm_2$ sample measured by SQUID magnetometry as shown in FIG. 7(c).

The giant planar Hall effect in ferromagnetic semiconductor devices, and in particular in (Ga,Mn)As devices, as described herein enables systematic investigation of in-plane magnetic anisotropy and magnetization reversal via electrical transport measurements. In semiconducting materials, GPHE measurements provide unique advantages over magneto-optical techniques. For example, carrier concentration changes arising from sample illumination can be circumvented. It is also notable that the high signal-to-noise attainable in GPHE measurements permits observation of behavior that emerges only in structures of reduced dimensions (e.g., Barkhausen jumps in 6 $\mu$m devices). Given the minimal excitation power required, the present invention is compatible with very low temperature measurements (~mK), thus offering new possibilities for investigations in micro- and nanoscale spintronic devices.

While the description of the present invention was influenced by the preferred embodiments discussed in detail, it is expected that some modifications or enhancements to the present invention could be made by those skilled in the art without deviating from the essence of the present invention. Therefore, the invention should be measured in terms of the claims that follow.

What is claimed is:

1. A ferromagnetic semiconductor composition, comprising:
    a substrate layer; and
    a ferromagnetic semiconductor epilayer formed on the substrate, said epilayer defining a plane and having a cubic hard axis;
    wherein a voltage transverse to said cubic hard axis is detectable in response to an applied current flow along the cubic hard axis.

2. The composition of claim 1, wherein the application of an in-plane magnetic field, non-aligned with the cubic hard axis, produces a transition in the transverse magnetic resistance of the epilayer.

3. The composition of claim 2, wherein the applied in-plane magnetic field is sufficiently strong such that the transition is substantially abrupt.

4. The composition of claim 1, wherein the substrate is a GaAs substrate, and wherein the epilayer includes Mn doped GaAs ((Ga, Mn)As)).

5. The composition of claim 4, wherein the concentration ratio of Ga to Mn in the epilayer is approximately 948 to 52.

6. The composition of claim 4, wherein the concentration ratio of Ga to Mn is between approximately 100:1 and 100:8.

7. The composition of claim 1, wherein the substrate is selected from the group consisting of GaAs and GaN.

8. The composition of claim 1, wherein the epilayer is selected from the group consisting of Mn doped GaAs and Mn doped GaN.

9. The composition of claim 1, wherein the substrate includes a buffer layer formed thereon and disposed between the substrate and the epilayer.

10. The composition of claim 9, wherein the buffer layer includes p-type GaAs.

11. The composition of claim 10, wherein the p-type GaAs is Be doped GaAs.

12. The composition of claim 10, wherein the epilayer includes Mn doped GaAs.

13. The composition of claim 12, wherein the buffer layer is approximately 300 nm thick and wherein the epilayer is approximately 150 nm thick.

14. The composition of claim 1, wherein the epilayer is between approximately 10 nm thick and approximately 350 nm thick.

15. The composition of claim 1, wherein the epilayer is formed by molecular beam epitaxy.

16. A ferromagnetic semiconductor device, comprising:
    a substrate defining a plane;
    a ferromagnetic semiconductor epilayer formed on said substrate, said epilayer being substantially elongated and oriented along a cubic hard axis; and
    first and second electrical contacts, each contact coupled to an end of the elongated epilayer, said contacts being configured to provide an electrical current flow along the hard axis;
    wherein application of an electrical current flow along the hard axis produces a voltage substantially transverse to said hard axis.

17. The device of claim 16, further including first and second transverse voltage probes coupled at opposite sides of the elongated epilayer, said first and second probes being substantially equidistant from an end of the epilayer, wherein said voltage probes detect said transverse voltage responsive to said current flow.

18. The device of claim 16, further including a plurality of transverse voltage probe pairs, each pair including a probe coupled at opposite sides of the epilayer, each pair defining a voltage detection region substantially perpendicular to the cubic hard axis.

19. The device of claim 16, wherein application of an in-plane magnetic field, non-aligned with the cubic hard axis, produces a transition in the transverse magnetic resistance of the epilayer.

20. The device of claim 19, wherein the applied magnetic field is sufficiently strong such that the transition is substantially abrupt.

21. The device of claim 16, wherein the substrate is a GaAs substrate, and wherein the epilayer includes Mn doped GaAs ((Ga, Mn)As)).

22. The device of claim 21, wherein the concentration ratio of Ga to Mn in the epilayer is approximately 948 to 52.

23. The device of claim 21, wherein the concentration ratio of Ga to Mn is between approximately 100:1 and 100:8.

24. The device of claim 16, wherein the substrate is selected from the group consisting of GaAs,and Mn doped GaN.

25. The device of claim 16, wherein the epilayer is selected from the group consisting of Mn doped GaAs and Mn doped GaN.

26. The device of claim 16, wherein the substrate includes a buffer layer formed thereon and disposed between the substrate and the epilayer.

27. The device of claim 26, wherein the buffer layer includes p-type GaAs.

28. The device of claim 27, wherein the p-type GaAs is Be doped GaAs.

29. The device of claim 27, wherein the epilayer includes Mn doped GaAs.

30. The device of claim 16, wherein the epilayer is between approximately 10 nm thick and approximately 350 nm thick.

31. The device of claim 16, wherein the epilayer is formed by molecular beam epitaxy.

32. A method of measuring magnetic domain wall parameters in ferromagnetic-semiconductor materials, comprising:

providing a test sample including a ferromagnetic semiconductor epilayer formed on a substrate, said epilayer being substantially planar and having a cubic hard axis and being substantially elongated;

providing a current flow along the cubic hard axis; and detecting a transverse voltage in the epilayer responsive to said current flow at each of a plurality of transverse voltage probe pairs in contact with the epilayer, each pair having probes in contact with the epilayer on opposite sides relative to the cubic hard axis.

33. The method of claim 32, further comprising applying an in-plane magnetic field to the test sample.

34. The method of claim 33, wherein said applied magnetic field is non-aligned with the cubic hard axis.

35. The method of claim 33, wherein the applied field is fixed in magnitude, and wherein applying includes sweeping the orientation of the magnetic field relative to the cubic hard axis.

36. The method of claim 35, wherein sweeping includes sweeping the magnetic field by $2\pi$.

37. The method of claim 33, further including applying a saturation field to the test sample before applying the in-plane magnetic field.

38. The method of claim 34, wherein the applied field is fixed in orientation relative to the cubic hard axis, and wherein the magnitude of the applied magnetic field is altered.

39. The method of claim 32, further including processing the transverse voltages detected by the transverse voltage probe pairs so as to determine one or more parameters associated with a magnetic domain wall in the epilayer.

40. The method of claim 39, wherein the one or more parameters include one of domain wall velocity and transverse magnetic resistance.

41. The method of claim 32, wherein the substrate is a GaAs substrate, and wherein the epilayer includes Mn doped GaAs ((Ga, Mn)As)).

42. The method of claim 41, wherein the concentration ratio of Ga to Mn in the epilayer is approximately 948 to 52.

43. The method of claim 41, wherein the concentration ratio of Ga to Mn is between approximately 100:1 and 100:8.

44. The method of claim 32, wherein the substrate is selected from the group consisting of GaAs and GaN.

45. The method of claim 44, the epilayer is selected from the group consisting of Mn doped GaAs and Mn doped GaN.

46. The method of claim 32, wherein the sample includes a buffer layer formed between the substrate and the epilayer.

47. The method of claim 32, wherein the substrate is a type III–V semiconductor.

48. The method of claim 47, wherein the epilayer is a type III–V semiconductor doped with Mn.

49. The composition of claim 1, wherein the substrate is a type III–V semiconductor.

50. The composition of claim 49, wherein the epilayer is a type III–V semiconductor doped with Mn.

51. The device of claim 16, wherein the substrate is a type III–V semiconductor.

52. The device of claim 51, wherein the epilayer is a type III–V semiconductor doped with Mn.

* * * * *